US006753098B2

(12) United States Patent
Aziz et al.

(10) Patent No.: US 6,753,098 B2
(45) Date of Patent: *Jun. 22, 2004

(54) ORGANIC LIGHT EMITTING DEVICES

(75) Inventors: Hany Aziz, Burlington (CA); Nan-Xing Hu, Oakville (CA); Cuong Vong, Hamilton (CA); Ah-Mee Hor, Mississauga (CA); Zoran D. Popovic, Mississauga (CA)

(73) Assignee: Xerox Corporation, Stamford, CT (US)

( * ) Notice: Subject to any disclaimer, the term of this patent is extended or adjusted under 35 U.S.C. 154(b) by 206 days.

This patent is subject to a terminal disclaimer.

(21) Appl. No.: 10/005,993

(22) Filed: Nov. 8, 2001

(65) Prior Publication Data

US 2003/0087125 A1 May 8, 2003

(51) Int. Cl.$^7$ .............................................. H05B 33/12

(52) U.S. Cl. ........................ 428/690; 428/917; 428/213; 428/332; 313/504; 313/506

(58) Field of Search ................................ 428/213, 332, 428/690, 917; 313/504, 506; 427/66

(56) References Cited

U.S. PATENT DOCUMENTS

| | | | |
|---|---|---|---|
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/690 |
| 5,061,569 A | 10/1991 | VanSlyke et al. | 428/457 |
| 5,141,671 A | 8/1992 | Bryan et al. | 252/301.16 |
| 5,150,006 A | 9/1992 | VanSlyke et al. | 313/504 |
| 5,151,629 A | 9/1992 | VanSlyke | 313/504 |
| 5,227,252 A | 7/1993 | Murayama et al. | 428/690 |
| 5,458,977 A * | 10/1995 | Hosokawa et al. | 428/411.1 |
| 5,516,577 A | 5/1996 | Matsuura et al. | 428/212 |
| 5,601,903 A | 2/1997 | Fujii et al. | 428/212 |
| 5,639,914 A * | 6/1997 | Tomiyama et al. | 564/309 |
| 5,739,635 A | 4/1998 | Wakimoto | 313/504 |
| 5,792,557 A * | 8/1998 | Nakaya et al. | 428/411.1 |
| 5,846,666 A | 12/1998 | Hu et al. | 428/690 |
| 5,853,905 A | 12/1998 | So et al. | 428/690 |
| 5,925,472 A | 7/1999 | Hu et al. | 428/690 |
| 5,925,980 A | 7/1999 | So et al. | 313/504 |
| 5,935,720 A | 8/1999 | Chen et al. | 428/690 |
| 5,942,340 A | 8/1999 | Hu et al. | 428/690 |
| 5,952,115 A | 9/1999 | Hu et al. | 428/690 |
| 6,020,078 A | 2/2000 | Chen et al. | 428/690 |
| 6,048,630 A | 4/2000 | Burrows et al. | 428/690 |
| 6,057,048 A | 5/2000 | Hu et al. | 428/690 |
| 6,114,055 A | 9/2000 | Choong et al. | 428/690 |
| 6,130,001 A | 10/2000 | Shi et al. | 428/690 |
| 6,229,012 B1 | 5/2001 | Hu et al. | 544/180 |
| 2001/0053462 A1 * | 12/2001 | Mishima | 428/690 |
| 2002/0034659 A1 * | 3/2002 | Nishi et al. | 428/690 |

OTHER PUBLICATIONS

Copending Application Ser. No. 09/357,551, filed Jul. 20, 1999, on "Organic Light Emitting Devices Having Improved Efficiency and Operation Lifetime" by Hany Aziz et al.
Copending Application Ser. No. 09/606,670, filed Jun. 30, 2000, on "Organic Light Emitting Devices Having Improved Performance" Hany Aziz et al.
Copending Application Ser. No. 09/800,716 on "Cathodes for Electroluminescent Devices Having Improved Contrast and Reduced Dark Spot Growth" by Yoon–Fei Liew et al.
Copending Application Ser. No. 09/770,159, filed Jan. 26, 2001, on "Organic Light Emitting Devices" by Hany Aziz et al.
Copending Application Ser. No. 09/770,154, filed Jan. 26, 2001, on "Electroluminescent Devices" by Hany Aziz et al.
Copending Application Ser. No. 09/935,031, filed Aug. 22, 2001, on "OLEDS Having Light Absorbing Electrode" by Hany Aziz et al.
S.A. Van Slyke et al., "Organic Electroluminescent Devices with Improved Stability", Appl. Phys.Lett. 69, pp. 2160–2162, 1996.
Kido et al., "Organic Electroluminescent Devices Based on Molecularly Doped Polymers", Appl. Phys. Lett. 61, pp. 761–763, 1992.
S. Naka et al., "Organic Electroluminescent Devices Using a Mixed Single Layer," Jpn. J. Appl. Phys. 33, pp. L1772–L1774, 1994.
W. Wen et al., Appl. Phys. Lett. 71, 1302 (1997).
C. Wu et al., "Efficient Organic Electroluminescent Devices Using Single–Layer Doped Polymer Thin Films with Bipolar Carrier Transport Abilities", IEEE Transactions on Electron Devices 44, pp. 1269–1281, 1997.
H. Aziz et al., Science 283, 1900 (1999).
Z.D. Popovic et al., Proceedings of the SPIE, vol. 3176, "Organic Light–Emitting Materials and Devices II", San Diego, CA, Jul. 21–23, (1998) pp. 68 to 73.
Y. Hamada et al., "The Influence of the Emission Site on the Running Durability of Organic Electroluminescent Devices", Jpn. J. Appl. Phys. 34, pp. L824–L826, (1995).
Zhou et al., "Real–Time Observation of Temperature Rise and Thermal Breakdown Processes in Organic Leds Using an IR Imaging And Analysis System", Advanced Materials 12, pp 265–269, (2000).
J.R. Sheats et al., "Organic Electroluminescent Devices", Science 273, pp. 884–888, (1996).
S. Tokito et al., "High–Temperature Operation of an Electroluminescent Device Fabricated Using a Novel Triphenylamine Derivative", Appl. Phys. Lett. 69, 878 (1996).

(List continued on next page.)

Primary Examiner—Cynthia H. Kelly
Assistant Examiner—Dawn Garrett
(74) Attorney, Agent, or Firm—E. O. Palazzo

(57) ABSTRACT

An electroluminescence (EL) device containing a number of layers, including two electrodes and positioned between the electrodes a mixed region, a hole transport region, and an electron transport region, wherein the mixed region contains, for example, biphenyl TPD, an electron transport compound and a luminescent compound.

45 Claims, 1 Drawing Sheet

OTHER PUBLICATIONS

Kido et al., "White light emitting organic electroluminescent device using lanthanide complexes", *Jpn. J. App. Phys.*, vol. 35, pp. L394–L396 (1996).

Baldo et. al., "Highly efficient organic phosphorescent emission from organic electroluminescent devices", *Letters to Nature*, vol. 395, pp 151–154 (1998).

* cited by examiner

ORGANIC LIGHT EMITTING DEVICES

COPENDING APPLICATIONS

Illustrated in copending application U.S. Ser. No. 10/005,930, U.S. Publication No. 20030134146, filed concurrently herewith, the disclosure of which is totally incorporated herein by reference, is an organic light emitting device comprising
  (i) a first electrode;
  (ii) a mixed region comprising a first hole transport material and a first electron transport material;
  (iii) a second electrode;
  (iv) an optional thermal protective layer coated on one of the first and second electrodes, wherein one of said first and second electrodes is a hole injection anode, and one of said electrodes is an electron injection cathode, and wherein the organic light emitting device further comprises at least one of
  (v) a hole transport region interposed between said anode and said mixed region; and wherein said hole transport region is comprised of a second hole transport material, and which material is in contact with the mixed region; and
  (vi) an electron transport region interposed between said cathode and said mixed region, and wherein said region is comprised of a second electron material, and which material is in contact with the mixed region; and containing at least one of
    a. said hole transport region (v) wherein said first hole transport material (ii) is similar to or dissimilar than said second hole transport material (v);
    b. said electron transport region (vi) wherein said first electron transport material (ii) is similar to or dissimilar than said second electron transport material;
    and wherein when a. is similar, b. is dissimilar; when a. is dissimilar, b. is similar or dissimilar; and when b. is dissimilar, a. is similar or dissimilar.

Illustrated in copending application U.S. Ser. No. 10/005,404, U.S. Publication No. 20030104242, filed concurrently herewith, the disclosure of which is totally incorporated herein by reference, is an organic light emitting device comprising
  (i) a first electrode;
  (ii) a region comprising a mixture of (1) a tertiary aromatic amine, (2) a metal oxinoid, and (3) a red emitting material represented by

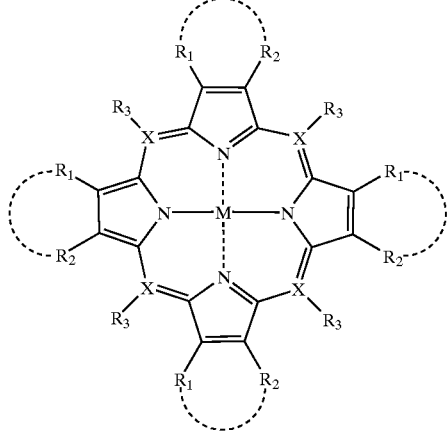

wherein X is a carbon C atom or a nitrogen N atom, or optionally oxygen or sulfur; $R_1$, $R_2$ and $R_3$ are each independently selected from the group consisting of hydrogen, alkyl, substituted alkyl, aryl, and substituted aryl; M is a divalent, trivalent or tetravalent metal;
  (iii) a second electrode;
  (iv) an optional protective element coated on at least one of the first and second electrodes; wherein one of said first and second electrodes is a hole injection anode, and one of said electrodes is an electron injection cathode; and at least one of
  (v) a hole transport region situated between the anode and the region (ii), and wherein the hole transport region optionally includes a buffer layer; and
  (vi) an electron transport region situated between the cathode and the region (ii), and wherein said red emitting component is present in an amount of from 1 to about 40 weight percent based on total weights of components in region (ii).

Illustrated in copending application U.S. Ser. No. 10/055,518, U.S. Publication No. 20030104243, filed concurrently herewith, the disclosure of which is totally Incorporated herein by reference, is an organic light emitting device comprising
  (i) a first electrode;
  (ii) a mixed region comprising a mixture of (1) a tertiary aromatic amine, (2) a metal oxinoid, and (3) a green emitting coumarin dye of the Formula

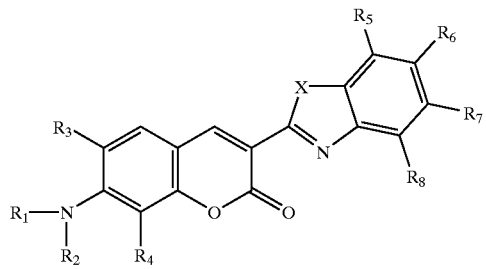

wherein X is selected from the group consisting of an oxygen atom, a sulfur atom, an alkyl imino group and aryl imino group; $R_1$ and $R_2$ are individually selected from the group consisting of alkyl, aryl, and carbocyclic; $R_3$ and $R_4$ are individually selected from the group consisting of a hydrogen atom, alkyl, and optionally a branched or unbranched 5 or 6 member substituent ring connecting with $R_1$ and $R_2$, respectively; and $R_5$, $R_6$, $R_7$, and $R_8$ are individually selected from the group consisting of a hydrogen atom, an alkoxy group and an alkyl group;
  (iii) a second electrode;
  (iv) an optional thermal protective element coated on one of the first and second electrodes; wherein one of the first and second electrodes is a hole injecting anode, and one of the first and second electrodes is an electron injecting cathode, and wherein the organic light emitting device further comprises at least one of
  (v) a hole transport region interposed or situated between the anode and the mixed region, wherein the hole transport region optionally includes a buffer layer; and
  (vi) an electron transport region interposed between the cathode and the mixed region, and wherein said green emitting dye is present in an amount of from about 0.01 to about 10 weight percent based on the total of said mixed layer components (ii).

Illustrated in copending application U.S. Ser. No. 10/005,970, U.S. Publication No. 20030104244, filed concurrently herewith, the disclosure of which is totally incorporated herein by reference, is an organic light emitting device comprising (i) an anode;
(ii) a hole transport layer comprising a mixture of a porphyrin and a hole transport material;
(iii) a mixed region comprising a mixture of (1) a hole transport material, and (2) an electron transport material, and which mixed region optionally contains an organic luminescent material;
(iv) a cathode; and wherein the organic light emitting device optionally further comprises at least one of
(v) an electron transport region interposed between the mixed region and the cathode; and
(vi) an optional thermal protective element coated on one of the anode and cathode.

Illustrated in copending application U.S. Ser. No. 09/935,031, filed Aug. 22, 2001 on "OLEDs Having Light Absorbing Electrode", U.S. Publication No. 20030038593, the disclosure of which is totally incorporated herein by reference, is an organic light emitting device comprising a first electrode;
a second electrode; and
a luminescent region including an organic electroluminescent material between the first electrode and the second electrode, wherein one of the first electrode and the second electrode includes both a substantially transparent charge injecting layer adjacent to the luminescent region and an electrically conductive light absorbing layer.

Illustrated in U.S. Pat. No. 6,392,339 on "Organic Light Emitting Devices Having Improved Efficiency and Operation Lifetime", filed on Jul. 20, 1999, the disclosure of which is totally incorporated herein by reference, is an organic light emitting device, comprising, for example, a mixed region comprising a mixture of a hole transport material and an electron transport material, one of the hole transport material and the electron transport material being an emitter, the mixed region having a first surface and a second surface;
at least one of (i) a hole transport material on the first surface, and (ii) an electron transport material on the second surface;
an anode in contact with the hole transport material on the first surface or with the first surface; and
a cathode in contact with the electron transport material on the second surface or with the second surface; and U.S. Pat. No. 6,392,250 on "Organic Light Emitting Devices Having Improved Performance", filed on Jun. 30, 2000, the disclosure of which is totally incorporated herein by reference, is an organic light emitting device, comprising, for example,
a mixed region having a first surface and a second surface, the mixed region comprising a mixture of a hole transport material, an electron transport material and at least one dopant, the dopant being an emitter, at least one of the hole transport material and the electron transport material optionally being an emitter;
at least one of (i) a hole transport region on the first surface, and (ii) an electron transport region on the second surface;
an anode in contact with the hole transport region on the first surface or with the first surface; and
a cathode in contact with the electron transport region on the second surface or with the second surface.

Illustrated in copending applications U.S. Ser. No. 09/770,159 on "Organic Light Emitting Devices", filed Jan. 28, 2001, U.S. Publication No. 20020135296, the disclosure of which is totally incorporated herein by reference, is an organic light emitting device comprising, for example, in an optional sequence (i) a substrate;
(ii) a first electrode;
(iii) a mixed region comprising a mixture of a hole transport material and an electron transport material, and wherein this mixed region includes at least one organic luminescent material;
(iv) a second electrode;
(v) a thermal protective element coated on the second electrode, wherein one of the two said first and second electrodes is a hole injection anode, and one of the two said electrodes is an electron injection cathode, and wherein the organic light emitting device further comprises;
(vi) a hole transport region, interposed between the anode and the mixed region, wherein the hole transport region optionally includes a buffer layer; and
(vii) an electron transport region interposed between the second electrode and the mixed region; and in U.S. Ser. No. 09/770,154 on "Electroluminescent Devices", filed on Jan. 26, 2001, U.S., Publication No. 20020145350, the disclosure of which is totally incorporated herein by reference, is disclosed an organic light emitting device comprising in sequence
a substrate;
a first electrode;
a light emitting region comprising an organic luminescent material; and
a second electrode, and a thermal protective element.

Illustrated in application U.S. Ser. No. 09/800,716, now abandoned, on "Cathodes For Electrofuminoscent Devices Having improved Contrast and Reduced Dark Spot Growth", filed on Mar. 8, 2001, the disclosure of which is totally incorporated herein by reference, is an electroluminescent device, comprising:

a first electrode;
a second electrode; and
a luminescent region between the first electrode and the second electrode, wherein one of the first electrode and the second electrode comprises a metal-organic mixed region including:
a metal;
an organic material; and
at least one component selected from the group consisting of metals, organic materials and inorganic materials.

BACKGROUND

This invention relates to optoelectronic devices and, more particularly, to organic light emitting devices (organic EL devices). More specifically, the present invention relates to substantially stable organic EL devices with extended operational lifetimes, such as at least about 1,000 hours, before their luminance decreases to some percent of the initial value, such as about 50 percent of the initial luminance, and which devices in embodiments, for example, are substantially stable at high temperatures, such as from about 70° C. to about 100° C.

The organic light emitting devices, according to embodiments of the present application, can provide operational stability at high temperatures, such as, for example, an operational lifetime of several hundreds of hours, such as 1,200 hours at a high brightness of, for example, about 1,500 candelas per square meter ($cd/m^2$) at temperatures of from about 80° C. to about 100° C., which corresponds to up to several thousands of hours of life, such as about 10,000 hours for typical display luminance of about 100 $cd/m^2$ at temperatures of from about 70° C. to about 100° C. In addition, the organic light emitting devices of the present application can in embodiments utilize materials that have high glass transition temperature, such as a glass transition temperature of about 110° C., and are potentially more economical to synthesize than, for example, N,N'-di(naphthalene-1-yl)-N,N'-diphenyl-benzidine (NPB). The organic light emitting devices of the present invention can be used for various applications, and especially high temperature technological applications that usually require high temperature stability over long periods of times, such as, for example, about 500 to about 12,000 hours. In addition, an organic light emitting device according to embodiments of the present invention can provide different emission colors, such as, for example, red, yellow, green and blue.

REFERENCES

An organic electroluminescent (EL) device can be comprised of a layer of an organic luminescent material interposed between an anode, typically comprised of a transparent conductor, such as indium tin oxide, and a cathode, typically a low work function metal such as magnesium, calcium, aluminum, or the alloys thereof with other metals. The EL device functions on the primary principle that under an electric field, positive charges (holes) and negative charges (electrons) are respectively injected from the anode and cathode into the luminescent layer and undergo recombination to form excitonic states which subsequently emit light. A number of organic EL devices have been prepared from a laminate of an organic luminescent material and electrodes of opposite polarity, which devices include a single crystal material, such as single crystal anthracene as the luminescent substance as described, for example, in U.S. Pat. No. 3,530,325, the disclosure of which is totally incorporated herein by reference. These types of devices are believed to require excitation voltages on the order of 100 volts or greater.

An organic EL device with a multilayer structure can be formed as a dual layer structure comprising one organic layer adjacent to the anode supporting hole transport, and another organic layer adjacent to the cathode supporting electron transport and acting as the organic luminescent zone of the device. Examples of these devices are disclosed in U.S. Pat. Nos. 4,356,429; 4,539,507; 4,720,432, and 4,769,292, the disclosures of which are totally incorporated herein by reference, wherein U.S. Pat. No. 4,769,292, the disclosure of which is totally incorporated herein by reference, discloses, for example, an organic EL device comprising three separate layers, a hole transport layer, a luminescent layer, and an electron transport layer, which layers are laminated in sequence and are sandwiched between an anode and a cathode, and wherein a fluorescent dopant material is added to the emission zone or layer whereby the recombination of charges results in the excitation of the fluorescent material. In some of these multilayer structures, such as, for example, organic light emitting devices described in U.S. Pat. No. 4,720,432, the disclosure of which is totally incorporated herein by reference, the organic light emitting device further comprises a buffer layer interposed between the hole transport layer and the anode. The combination of the hole transport layer and the buffer layer forms a dual-layer hole transport region, reference S. A. Van Slyke et al., "Organic Electroluminescent Devices with Improved Stability," Appl. Phys. Lett. 69, pp. 2160–2162, 1996, the disclosure of which is totally incorporated herein by reference.

There have also been attempts to obtain electroluminescence from organic light emitting devices containing mixed layers, for example, layers in which both the hole transport material and the emitting electron transport material are mixed together in one single layer, see, for example, Kido et al., "Organic Electroluminescent Devices Based On Molecularly Doped Polymers," Appl. Phys. Lett. 61, pp. 761–763, 1992; S. Naka et al., "Organic Electroluminescent Devices Using a Mixed Single Layer," Jpn. J. Appl. Phys. 33, pp. L1772–L1774, 1994; W. Wen et al., Appl. Phys. Lett. 71, 1302 (1997); and C. Wu et al., "Efficient Organic Electroluminescent Devices Using Single-Layer Doped Polymer Thin Films with Bipolar Carrier Transport Abilities", IEEE Transactions on Electron Devices 44, pp. 1269–1281, 1997. In a number of these devices, the electron transport material and the emitting material can be the same or the mixed layer can further comprise an emitting material as a dopant. Other examples of organic light emitting devices which are formed of a single organic layer comprising a hole transport material and an electron transport material can be found, for example, in U.S. Pat. Nos. 5,853,905; 5,925,980; 6,114,055 and 6,130,001, the disclosures of which are totally incorporated herein by reference. As indicated in the article by S. Naka et al., these single mixed layer organic light emitting devices are generally less efficient than multilayer organic light emitting devices. These devices, which include only a single mixed layer of a hole transport material, such as NBP (N,N'-di(naphthalene-1-yl)-N,N'-diphenyl-benzidine), and an emitting electron transport material, such as Alq3 (tris (8-hydroxyquinoline) aluminum), are believed to be unstable and to have poor efficiency. The instability of these devices is believed to be caused by the direct contact between the electron transport material in the mixed layer and the hole injecting contact comprised of indium tin oxide (ITO), which results in the formation of an unstable cationic electronic transport material, and the instability of the mixed layer/cathode interface, see H. Aziz et al., Science 283, 1900 (1999), the disclosure of which is totally incorporated herein by reference. In addition, the single mixed layer may result in high leakage currents and hence poor efficiency, see Z. D. Popovic et al., Proceedings of the SPIE, Vol. 3176, "Organic Light-Emitting Materials and Devices II", San Diego, Calif., Jul. 21–23, 1998, pp. 68 to 73, the disclosure of which is totally incorporated herein by reference.

While recent progress in organic EL research has elevated the potential of organic EL devices for widespread applications, the operational stability of current available devices may in some instances be below expectations. A number of known organic light emitting devices have relatively short operational lifetimes before their luminance drops to some percentage of its initial value. Providing interface layers as described, for example, in S. A. Van Slyke et al., "Organic Electroluminescent Devices with Improved Stability," Appl. Phys. Lett. 69, pp. 2160–2162, 1996, and doping as described, for example, in Y. Hamada et al., "Influence of the Emission Site on the Running Durability of Organic Electroluminescent Devices", Jpn. J. Appl. Phys. 34, pp. L824–L826, 1995, may perhaps increase the operational lifetime of organic light emitting devices for room temperature operation, however, the effectiveness of these organic light emitting devices deteriorates for high temperature device operation. In general, the device lifetime can be reduced by a factor of about two for each 10° C. increment in the operational temperature. Moreover, at high temperatures, the susceptibility of the organic light emitting devices to degrade is increased as described, for example, in Zhou et al., "Real-Time Observation of Temperature Rise and Thermal Breakdown Processes in Organic Leds Using an IR Imaging And Analysis System", Advanced Materials 12, pp 265–269, 2000, which further reduces the stability of the devices. As a result, the operational lifetime of these organic light emitting devices at a normal display luminance level of about 100 cd/m2 is limited, for example, to about a hundred hours or less at temperatures of about 60° C. to about 80° C., reference J. R. Sheats et al., "Organic Electroluminescent Devices", Science 273, pp. 884–888, 1996, and also S. Tokito et al., "High-Temperature Operation of an Electroluminescent Device Fabricated Using a Novel Triphenylamine Derivative", Appl. Phys. Lett. 69, 878 (1996).

SUMMARY

Aspects disclosed herein relate to an organic light emitting device comprising (i) a first electrode;

(ii) a region comprising a mixture of (1) N,N'-bis(p-biphenyl)-N,N'-diphenyl benzidine, and (2) an electron transport material, and which region further optionally comprises an organic luminescent material, and wherein the mixed region is capable of emitting light in response to hole-electron recombination;

(iii) a second electrode;

(iv) an optional thermal layer coated on at least one of the first and second electrodes, wherein one of the first and second electrodes is a hole injection anode, and one of the electrodes is an electron injection cathode, and wherein the organic light emitting device further comprises at least one of (v) a hole transport region interposed or situated between the first electrode and the mixed region; and (vi) an electron transport region interposed or situated between the mixed region and the cathode; a device wherein there is at least one of (A) the hole transport material comprising the hole transport region (v) is selected from the group consisting of aromatic amines, porphyrins and indolocarbazoles, and wherein (B) the electron transport material comprising the mixed region (ii) or the electron transport of region (vi) is selected from the group consisting of metal oxinoids, stilbenes, triazines, porphyrins, and quinolines; a device wherein in the mixed region (ii) the electron transport material is a metal oxinoid; a device wherein the mixed region comprises from about 20 weight percent to about 80 weight percent of the N,N'-bis(p-biphenyl)-N,N'-diphenyl benzidine; and the electron transport component or material is present in an amount of from about 80 weight percent to about 20 weight percent and the electron transport is a metal oxinoid, and wherein the weight percents are based on the total weight of materials comprising the mixed region (ii); a device wherein the mixed region comprises from about 35 weight percent to about 65 weight percent of the N,N'-bis(p-biphenyl)-N,N'-diphenyl benzidine (biphenyl TPD); and from about 65 weight percent to about 35 weight percent of the electron transport of a metal oxinoid, and wherein the weight percent total thereof is about 100 weight percent; a device wherein the metal oxinoid is selected from the group consisting of tris(8-hydroxyquinoline) aluminum ($Alq_3$) and bis(8-hydroxyquinolato)-(4-phenylphenolato)aluminum (Balq); a device wherein the electron transport region (vi) contains $Alq_3$ or Balq, and the mixed region (ii) contains from about 0.01 weight percent to about 10 weight percent of a fluorescent luminescent material; a device wherein the fluorescent material is selected from the group consisting of coumarin, dicyanomethylene pyranes, polymethine, oxabenzanthrane, xanthene, pyrylium, carbostyl, perylene, acridone, quinacridone, rubrene, anthracene, coronene, phenanthrecene, pyrene, butadiene, stilbene, lanthanide metal chelate complexes, rare-earth metal chelate complexes, and 4-(dicyanomethylene)-2-I-propyl-6-(1,1,7,7-tetramethyljulolidyl-9-enyl)-4H-pyran; a device wherein the fluorescent material is selected from the group consisting of rubrene, N,N'-dimethylquinacridone (DMQ), 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T), and (2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4-ylidene) propanedinitrile (DCJTB); a device wherein the mixed region comprises from about 3 weight percent to about 30 weight percent of a luminescent material, and wherein the luminescent material is a phosphorescent material; a device wherein the phosphorescent material is selected from the group consisting of 2,3,7,8,12,13,17,18-octaethyl-21H,23H-phorpine platinum(II) (PtOEP) and fac tris(2-phenylpyridine)iridium ($Ir(ppy)_3$); a device wherein there is at least one of (A) the hole transport region (v) comprising N,N'-bis(p-biphenyl)-N,N'-diphenyl benzidine (biphenyl TPD); and (B) the electron transport region (vi) contains an electron transport material, and wherein the electron transport material in the mixed region (ii) and (vi) are similar components; a device wherein there is at least one of (A) the hole transport region (v) and the hole transport material (ii) are dissimilar than the (p-biphenyl)-N,N'-diphenyl benzidine; and (B) wherein the electron transport region (vi) contains an electron transport material, and wherein the electron transport material in the mixed region comprising the mixed region (ii) and region (vi) are dissimilar; a device wherein each of the regions (ii), (v) and (vi) contain from 1 to about 10 layers; a device wherein (1) a first layer of the electron transport region is contacting the mixed region, and which first layer comprises a material selected from the group consisting of metal oxinoids and quinolines; and wherein (2) a second layer of the electron transport region is contacting the cathode, and which second layer comprises a material selected from the group consisting of metal oxinoid, phthalocyanine and triazine; a device wherein the metal oxinoid is tris(8-hydroxyquinoline)aluminum ($Alq_3$), bis(8-hydroxyquinolato)-(4-phenylphenolato) aluminum (Balq), or a quinoline of 1,4-bis(4-phenylquinolin-2-yl)benzene, 4,4'-bis(4-phenylquinolin-2-yl)-1,1'-biphenyl (TA); and the second layer is a metal oxinoid of tris(8-hydroxyquinoline)aluminum ($Alq_3$), bis(8-hydroxyquinolato)-(4-phenylphenolato)aluminum (Balq), copper phthalocyanine (CuPc), or a triazine comprising 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1, 3,5-triazinyl])-1,1'-biphenyl, 4,4'-bis-[2-(4,6-di-p-methoxyphenyl-1,3,5-triazinyl)]-1,1'-biphenyl, or 4,4'-bis-[2-(4,6-di-m-methoxyphenyl-1,3,5-triazinyl)]-1,1'-biphenyl, 2,4,6-tris(4-biphenylyl)-1,3,5-triazine; a device wherein the hole transport region (v) is comprised of at least two layers; a device wherein one layer of the hole transport region contacts the anode, and which layer comprises a porphyrin; and (2) a second layer of the hole transport region contacts the mixed region, and which second layer comprises a material selected from the group consisting of tertiary aromatic amines, and indolocarbazoles; a device wherein the first layer comprises copper phthalocyanine, and the second layer comprises N,N'-bis(p-biphenyl)-N,N'-diphenyl benzidine (biphenyl TPD), 5,11-di-naphthyl-5,11-dihydroindolo[3,2-b]carbazole, or 2,8-dimethyl-5,11-di-naphthyl-5,11-dihydroindolo[3,2-b]carbazole; a device wherein the hole transport region comprises a layer comprised of a mixture of from about 25 weight percent to about 99 weight percent of a porphyrin, and from about 75 weight percent to about 1 weight percent of an aromatic tertiary amine or an indolocarbazole; a device wherein the hole transport region includes a layer comprised of a mixture of (i) a porphyrin of copper phthalocyanine (CuPc), and (ii) a tertiary aromatic amine of N,N'-bis(p-biphenyl)-N,N-diphenyl benzidine (biphenyl TPD), or an indolocarbazole of 5,11-di-naphthyl-5,11-dihydroindolo[3,2-b]carbazole, or 2,8-dimethyl-5,11-di-naphthyl-5,11-dihydroindolo[3,2-b]carbazole; a device wherein there is at least one of (A) the anode, which anode is optionally indium-tin-oxide, and (B) the cathode is selected from the group consisting of (i) a layer comprised of Mg and Ag; (ii) a layer comprised of Al; (iii) a layer comprised of indium-tin-oxide; or (iv) a layer comprised of (1) an organic compound, (2) Mg, and (3) Ag; a device wherein the cathode further comprises an alkaline metal or a compound thereof; a device wherein the alkaline metal is selected from the group consisting of Li, Na, K and Cs; a device wherein the thermal protective element is present and is comprised of a layer of SiO, $SiO_2$ or mixtures thereof; a device wherein the mixed region (ii) has a thickness of from about 5 nanometers to about 500 nanometers; the hole transport region (v) has a thickness of from about 5 nanometers to about 250 nanometers; and the electron transport region (vi) has a thickness of from about 5 nanometers to about 100 nanometers; a device comprising (i) an anode of indium-tin-oxide with a thickness of from about 30 to about 300 nanometers coated on a substrate, the anode and the substrate being capable of transmitting at least about 70 percent of radiation of a wavelength of from about 400 nanometers to about 750 nanometers;

(ii) a hole transport region situated on the anode comprised of a material selected from the group consisting of copper phthalocyanine (CuPc), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region has a thickness of from about 5 nanometers to about 100 nanometers;

(iii) a mixed region situated on the hole transport region comprised of from about 35 weight percent to about 65 weight percent of N,N'-bis(p-biphenyl)-N,N'-diphenyl benzidine (biphenyl TPD), and from about 65 weight percent to about 35 weight percent of tris(8-hydroxyquinoline) aluminum or bis(8-hydroxyquinolato)-(4-phenylphenolato) aluminum, wherein all weight percents are based on the total weight of materials comprising the mixed region, and wherein the thickness of the mixed region is from about 20 nanometers to about 200 nanometers;

(iv) an electron transport region situated on the mixed region comprised of tris(8-hydroxyquinoline) aluminum ($Alq_3$) or bis(8-hydroxyquinolato)-(4-phenylphenolato)aluminum (Balq) wherein the thickness of the electron transport region is from about 5 nanometers to about 50 nanometers;

(v) a cathode situated on the electron transport region comprised of one of a layer comprising (1) an Mg:Ag alloy or Al of a thickness of from about 50 nanometers to about 500 nanometers; and (2) from about 40 volume percent to about 55 percent of Mg; from about 2 volume percent to about 10 volume percent of Ag; and from about 55 volume percent to about 40 volume percent of $Alq_3$, wherein the thickness of the first layer is from about 100 nanometers to about 600 nanometers coated with the layers with a thickness of from about 50 nanometers to about 500 nanometers comprising a metal or a metal alloy; and (vi) a thermal protective layer situated on the cathode comprised of SiO, $SiO_2$ or mixtures thereof of a thickness of from about 100 nanometers to about 1,000 nanometers; a device wherein the mixed region further comprises one of (i) about 0.2 weight percent to about 2 weight percent of a luminescent material selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T);

(ii) about 0.2 weight percent to about 5 weight percent of (2-(1,1-dimethylethyl)-6-(2-(2,3,6,7-tetrahydro-1,1,7,7-tetramethyl-1H,5H-benzo(ij)quinolizin-9-yl) ethenyl)-4H-pyran-4-ylidene) propanedinitrile (DCJTB); and (iii) about 5 weight percent to about 25 weight percent of 2,3,7,8,12,13,17,18-octaethyl-21H,23H-phorpine platinum(II) (PtOEP); a device comprising (i) an anode of indium-tin-oxide with a thickness of from about 30 to about 300 nanometers coated on a substrate;

(ii) a hole transport region in contact with the anode comprised of a compound selected from the group consisting of N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region further comprises a buffer layer contacting the anode, and which buffer layer is comprised of copper phthalocyanine, wherein the thickness of the buffer layer is from about 10 nanometers to about 30 nanometers, and the thickness of the hole transport region is from about 5 nanometers to about 20 nanometers greater than the thickness of the buffer layer;

(iii) a mixed region situated on the hole transport region comprised of from about 35 weight percent to about 65 weight percent of N,N'-bis(p-biphenyl)-N,N'-diphenyl benzidine (biphenyl TPD) and from about 65 weight percent to about 35 weight percent of tris(8-hydroxyquinoline)aluminum or bis(8-hydroxyquinolato)-(4-phenylphenolato) aluminum, wherein all weight percents are based on the total weight of materials comprising the mixed region, and wherein the thickness of the mixed region is from about 20 nanometers to about 200 nanometers;

(iv) an electron transport region situated on the mixed region comprised of tris(8-hydroxyquinoline) aluminum (Alq$_3$) or bis(8-hydroxyquinolato)-(4-phenylphenolato)aluminum (Balq), wherein the thickness of the electron transport region is from about 5 nanometers to about 50 nanometers;

(v) a cathode situated on the electron transport region comprised of one of (1) a first layer comprised of Mg:Ag alloy or Al of a thickness of from about 50 nanometers to about 500 nanometers; and (2) a second layer comprised of from about 40 volume percent to about 55 volume percent of Mg; from about 2 volume percent to about 10 volume percent of Ag; and from about 55 volume percent to about 40 volume percent of Alq$_3$, wherein the thickness of the first layer is from about 100 nanometers to about 600 nanometers; and the second layer of thickness is from about 50 nanometers to about 500 nanometers and comprises a metal or a metal alloy; and (vi) a thermal protective layer situated on the cathode comprised of SiO, SiO$_2$ or mixtures thereof of a thickness of from about 100 nanometers to about 1,000 nanometers; a device wherein the mixed region further comprises one of (i) from about 0.2 weight percent to about 2 weight percent of a luminescent material selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T);

(ii) from about 0.2 weight percent to about 5 weight percent of (2-(1,1-dimethylethyl)-6-(2-(2,3,6,7-tetrahydro-1,1,7,7-tetramethyl-1H,5H-benzo(ij) quinolizin-9-yl)ethenyl)-4H-pyran-4-ylidene) propanedinitrile (DCJTB), and (iii) from about 5 weight percent to about 25 weight percent of 2,3,7,8,12,13,17,18-octaethyl-21H,23H-phorpine platinum(II) (PtOEP); a device comprising (i) an anode of indium-tin-oxide with a thickness of from about 50 to about 300 nanometers coated on a substrate, the anode and the substrate being capable of transmitting at least about 70 percent of radiation of wavelength of from about 400 nanometers to about 750 nanometers;

(ii) a hole transport region situated on the anode comprised of at least one material selected from the group consisting of copper phthalocyanine (CuPc), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo [3,2-b]carbazole; and which region has a thickness of from about 5 nanometers to about 100 nanometers;

(iii) a mixed region situated on the hole transport region comprised of from about 35 weight percent to about 65 weight percent of N,N'-bis(p-biphenyl)-N,N'-diphenyl benzidine (biphenyl TPD) and from about 65 weight percent to about 35 weight percent of tris(8-hydroxyquinoline)aluminum or bis(8-hydroxyquinolato)-(4-phenylphenolato) aluminum; and wherein the thickness of the mixed region is from about 20 nanometers to about 200 nanometers;

(iv) an electron transport region situated on the mixed region comprising (1) a first layer of thickness from about 5 nanometers to about 25 nanometers contacting the mixed region, wherein this first layer is comprised of a material selected from the group consisting of tris(8-hydroxyquinoline)aluminum (Alq$_3$), bis(8-hydroxyquinolato)-(4-phenylphenolato)aluminum (Balq), and 1,4-bis(4-phenylquinolin-2-yl)benzene, 4,4'-bis(4-phenylquinolin-2-yl)-1,1'-biphenyl (TA); and (2) a second layer of a thickness of from about 5 nanometers to about 25 nanometers contacting the cathode, wherein the second layer is comprised of a material selected from the group consisting of tris(8-hydroxyquinoline) aluminum (Alq$_3$), bis(8-hydroxyquinolato)-(4-phenylphenolato)aluminum (Balq), copper phthalocyanine (CuPc), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, and 2,4,6-tris(4-biphenylyl)-1,3,5-triazine;

(v) a cathode situated on the electron transport region comprised of one of (1) a layer comprised of Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag; and from about 55 volume percent to about 40 volume percent of Alq$_3$, wherein the thickness of the first layer is from about 100 nanometers to about 600 nanometers, and coated with a second layer of a thickness of from about 50 nanometers to about 500 nanometers comprising a metal or a metal alloy; and (vi) a thermal protective layer situated on the cathode comprised of SiO, SiO$_2$ or mixtures thereof of a thickness of from about 100 nanometers to about 1,000 nanometers; a device wherein the mixed region further comprises one of (i) from about 0.2 weight percent to about 2 weight percent of a luminescent material selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T);

(ii) from about 0.2 weight percent to about 5 weight percent of (2-(1,1-dimethylethyl)-6-(2-(2,3,6,7-tetrahydro-1,1,7,7-tetramethyl-1H,5H-benzo(ij) quinolizin-9-yl)ethenyl)-4H-pyran-4-ylidene) propanedinitrile (DCJTB); and (iii) from about 5 weight percent to about 25 weight percent of 2,3,7,8,12,13,17,18-octaethyl-21H,23H-phorpine platinum(II) (PtOEP; a device and comprising in sequence (i) the first electrode;
(ii) the mixed region with from about 1 to about 3 layers comprising a mixture of (1) N,N'-bis(p-biphenyl)-N, N'-diphenyl benzidine (biphenyl TPD), and (2) an electron transport component, and which mixed region further comprises an organic luminescent material;
(iii) the second electrode;
(iv) a thermal protective layer coated on one of the first and second electrodes wherein one of the first and second electrodes is a hole injection anode, and one of the electrodes is an electron injection cathode, and wherein the organic light emitting device further comprises at least one of (v) a hole transport region positioned between the first electrode and the mixed region; and (vi) an electron transport region positioned between the mixed region and the cathode; a device wherein the mixed region emits light in response to hole electron recombination; a device further including a buffer layer in the hole transport region (v); a device wherein the protective layer is present, and which device further contains a buffer layer; a device wherein each of the regions contains from 1 to about 5 layers; a device wherein each of the regions contains from about 2 to about 4 layers; a device wherein the electron transport of (ii) also functions as a luminescent material or a light emitter; a device wherein a luminescent component is further contained in the mixed region, and wherein the electron transport is free of functioning as an emitter; a device comprising (i) a first electrode;

(ii) a region comprising a mixture of (1) N,N'-bis(p-biphenyl)-N,N'-diphenyl benzidine, and (2) an electron transport material, and which region further optionally comprises an organic luminescent material, (iii) a second electrode;

(iv) an optional thermal layer coated on at least one of the first and second electrodes, wherein one of the first and second electrodes is a hole injection anode, and one of the electrodes is an electron injection cathode, and wherein the organic light emitting device further comprises at least one of (v) a hole transport region interposed or situated between the first electrode and the mixed region; and (vi) an electron transport region interposed or situated between the mixed region and the cathode, and wherein the device contains in the region (ii) a luminescent component wherein the electron transport material also functions as a luminescent component, or wherein the region (ii) is free of a luminescence component where the electron transport component also functions as a luminescent component; and an EL device comprising (i) a first electrode;

(ii) a mixed region which region can contain from 1 to about 5 layers comprising a mixture of (1) N,N'-bis(p-biphenyl)-N,N'-diphenyl benzidine (biphenyl TPD) hole transport material, and (2) an electron transport material, and which mixed region can further comprise an organic luminescent material; and which mixed region is emits light in response to hole-electron recombination;

(iii) a second electrode;

(iv) a thermal protective element or layer coated on one of the first and second electrodes, wherein one of the first and second electrodes is a hole injection anode, and one of the electrodes is an electron injection cathode, and wherein the organic light emitting device further comprises at least one of (v) a hole transport region, interposed between the anode and the mixed region, wherein the hole transport region includes a buffer layer; and (vi) an electron transport region interposed between the mixed region and the cathode; and wherein region refers, for example, to a single layer or a plurality of layers, typically 2 or 3, laminated on each other, each of a thickness of from about 5 nanometers to about 5,000 nanometers.

With further respect to the Figures, "region" refers to one layer unless otherwise indicated.

EMBODIMENTS

Figure 1:
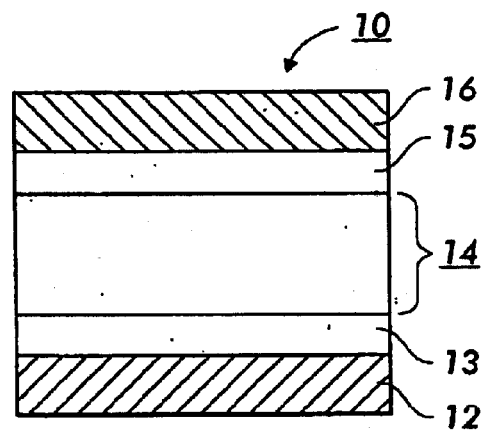
FIG. 1 illustrates an organic light emitting.

An organic light emitting device comprising both (i) a hole transport region situated between the anode and the mixed region, and (ii) an electron transport region between the cathode and the mixed region is illustrated in FIG. 1. The hole transport region and the electron transport region are believed to achieve a more balanced charge injection process, and to reduce leakage of the carriers to the counterelectrodes (Z. D. Popovic et al., *Proceedings of the SPIE*, Vol. 3176, "Organic Light-Emitting Materials and Devices II," San Diego, Calif., Jul. 21–23, 1998, pp. 68–73, the disclosure of which is totally incorporated herein by reference), and therefore, can demonstrate higher efficiency compared to a number of the organic light emitting devices of prior art, such as, for example, organic light emitting devices in U.S. Pat. Nos. 5,853,905; 5,925,980; 6,114,055; and 6,130,001.

The organic light emitting device 10 of FIG. 1 comprises a first electrode 12 serving as a hole injecting anode; laminated or coated on the first electrode 12 is a hole transport region 13 which may optionally include a buffer layer and laminated on the hole transport region 13 is a mixed region 14 comprising a mixture of (1) N,N'-bis(p-biphenyl)-N,N'-diphenyl benzidine (biphenyl TPD) hole transport material, and (2) an electron transport material, and which mixed region can further comprise an organic luminescent material (refers also to component or compound throughout), such as, for example, a fluorescent or a phosphorescent material; laminated on the mixed region 14 is an electron transport region 15 and laminated on the electron transport region 15 is a second electrode 16 serving as an electron injecting electrode. Depending, for example, on the charge transport properties of the materials used, it may be desirable in embodiments that the organic light emitting device comprise only one of the hole transport region and the electron transport region, that is, a hole transport region situated between the anode and the mixed region, and wherein the mixed region is in contact with the cathode, and optionally an electron transport region situated between the mixed region and the cathode, and a hole transport region between the anode and the mixed region.

Figure 2:
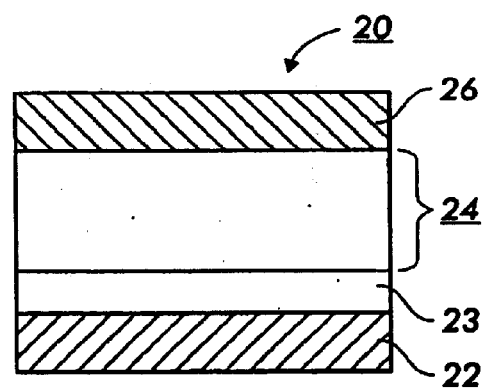
FIG. 2 illustrates another organic light emitting device.

Illustrated in FIG. 2 is an organic light emitting device which comprises a hole transport region and is free of an electron transport region wherein the device 20 comprises a first electrode 22 serving as a hole injecting anode; laminated on the first electrode 22 is a hole transport region 23 which may optionally include a buffer layer; laminated on the hole transport region 23 is a mixed region 24 comprising a mixture of (1) N,N'-bis(p-biphenyl)-N,N'-diphenyl benzidine (biphenyl TPD) hole transport material, and (2) an electron transport material, and which mixed region can further include an organic luminescent material, such as, for example, a fluorescent or a phosphorescent material; and laminated on the mixed region 24 is a second electrode 26 serving as an electron injecting electrode.

Figure 3:
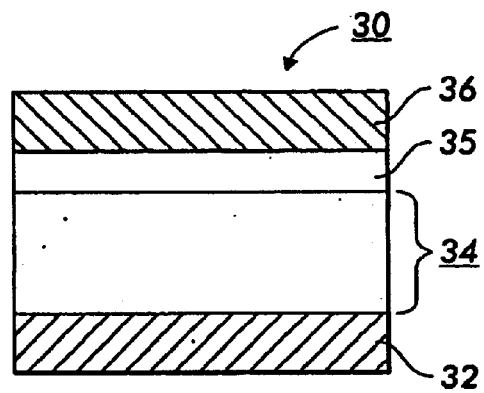
FIG. 3 illustrates yet another organic light emitting device.

Illustrated in FIG. 3 is an organic light emitting device which comprises an electron transport region with no hole transport region, and wherein the device 30 comprises a first electrode 32 serving as a hole injecting anode; laminated on the first electrode 32 is a mixed region 34 comprising a mixture of (1) N,N'-bis(p-biphenyl)-N,N'-diphenyl benzidine (biphenyl TPD) hole transport material, and (2) an electron transport material, and which mixed region further comprises an organic luminescent material, such as, for example, a fluorescent or a phosphorescent material; laminated on the mixed region 34 is an electron transport region or zone 35; laminated on the electron transport zone is a second electrode 36 serving as an electron injecting electrode.

Examples of the electron transport material present in the mixed regions 14, 24, 34 is a metal oxinoid, such as for example, tris(8-hydroxyquinoline)aluminum ($AlQ_3$); examples of the thermal protective layer are illustrated in U.S. Ser. Nos. 09/770,158 and 09/770,154, and which layer can be laminated on the first electrodes 12, 22, 32 or on the second electrodes 16, 26, 36, or more specifically, wherein the optional thermal protective element is laminated on the cathode.

In the EL devices, at least one of the hole transport regions 13, 23 situated between the anodes 12, 22 and the mixed regions 14, 24, and the electron transport regions 15, 35 situated between the mixed regions 14, 34 and the cathodes 16, 26 comprises a plurality of separate layers. The number of individual layers of the hole transport regions 13, 23 and the electron transport regions 15, 35 can be selectively varied. Typically, in such embodiments, the number of layers of either of these regions is from about 2 to about 10, and specifically 2 or 3. As illustrated in copending applications U.S. Ser. No. 09/770,159, and also in copending applications U.S. Ser. No. 10/005,930; U.S. Ser. No. 10,005,970; and U.S. Ser. No. 10/005,404, filed concurrently herewith, the disclosures of which are totally incorporated herein by reference, the multiple-layered hole transport regions 13, 23 and electron transport regions 15, 35 can enable several desirable effects, such as improving the injection of carriers into the mixed regions 14, 24, 34 reducing the operating voltage and improving device efficiency and/or stability.

The hole transport material comprising the hole transport regions 13, 23 can also be N,N'-bis(p-biphenyl)-N,N'-diphenyl benzidine (biphenyl TPD), or a different material. As illustrated in copending patent application U.S. Ser. No. 10/005,930, filed concurrently herewith, the disclosure of which is totally incorporated herein by reference, the use of different hole transport materials in the mixed regions 14, 24 and the hole transport regions 13, 23 can permit a number of desirable features, such as, for example, increasing the stability of the organic light emitting devices 10, 20. Also, the hole transport materials used for the different layers of the multiple-layer hole transport region can be different or similar.

Similarly, the electron transport material comprising the mixed regions 14, 24, 34 and the electron transport material comprising the electron transport regions 15, 35 can be the same material, or different materials. As illustrated in copending patent application U.S. Ser. No. 10/005,970, filed concurrently herewith, the disclosure of which is totally incorporated herein by reference, the use of different electron transport materials in the mixed regions 14, 24, 34 and the electron transport regions 15, 35 can enable desirable features, such as, for example, increasing the efficiency of the organic light emitting devices 10, 30. In addition, the electron transport materials used in the different layers of the multiple-layer electron transport region can be different or similar.

Hole transport regions 13, 23 include, for example, a layer comprising a mixture of a porphyrin and a hole transport material, such as, for example, a tertiary aromatic amine or an indolocarbazole, and wherein the hole transport region is formed of a layer comprising a mixture of a porphyrin, such as, for example, copper phthalocyanine (CuPc), and a hole transport material, such as for example, an indolocarbazole like 5,11-di-naphthyl-5,11-dihydroindolo[3,2-b]carbazole, 2,8-dimethyl-5,11-di-naphthyl-5,11-dihydroindolo[3,2-b] carbazole; or a tertiary aromatic amine, such as, for example, di(naphthalene-1-yl)-N,N'-diphenyl-benzidine (NPB) or N,N'-bis(p-biphenyl)-N,N'-diphenyl benzidine (biphenyl TPD).

One of the first electrodes and second electrodes comprises a metal-organic mixed region including (i) a first metal component, such as, for example, Mg; (ii) an organic material second component, such as, for example, $AlQ_3$; and (iii) at least one third component selected from the group consisting of metals, organic materials and inorganic materials, such as, for example, Ag, as illustrated in copending patent application U.S. Ser. No. 09/721,736, the disclosure of which is totally incorporated herein by reference. The cathode 16 can comprise a metal-organic mixed region including (i) a metal first component, such as, for example, Mg; (ii) an organic material second component, such as, for example, $AlQ_3$; and (iii) at least one third component selected from the group consisting of metals, organic materials and inorganic materials, such as, for example, Ag, thereby providing a number of desirable properties, such as, an increased contrast, better visibility and higher environmental stability of displays utilizing organic light emitting devices.

The organic light emitting devices can be operated under alternating current (AC) and/or direct current (DC) driving conditions. AC driving conditions can provide extended operational lifetimes, especially at high temperature device operation conditions. Examples of operating voltage include from about 3 to about 20 volts, and more specifically, from about 5 to about 15 volts; driving current examples include from about 1 to about 1,000 $mA/cm^2$ density, and more specifically, from about 10 $mA/cm^2$ to about 200 $mA/cm^2$.

The anodes 12, 22 and 32 can comprise suitable positive charge injecting electrode such as indium tin oxide (ITO), silicon, tin oxide, gold and platinum. Other suitable materials for the anode include, but are not limited to, electrically conductive carbon, π-conjugated polymers, such as polyaniline, polythiophene, polypyrrole, and the like having, for example, a work function equal to, or greater than, about 4 eV, and more specifically, from about 4 eV to about 6 eV. The anodes 12, 22, 32 can be of any suitable form, thus a thin conductive layer can be coated onto a light transmissive substrate, for example, a transparent or substantially transparent glass plate or plastic film, and wherein, for example, light transmissive anode can be formed from tin oxide or indium tin oxide (ITO) coated on a glass plate. Also, very thin light-transparent metallic anodes having a thickness, for example, of less than about 200 Å (Angstroms), and specifically, from about 75 Å to about 150 Å can be used. These thin anodes can comprise metals such as gold, palladium and the like. In addition, transparent or semitransparent thin layers of conductive carbon or conjugated polymers, such as polyaniline, polythiophene, polypyrrole and the like, with a thickness of, for example, from 50 Å to about 175 Å can be used as anodes. Specific examples of the anodes 12, 22, 32 and the cathodes 16, 26, 36 are disclosed in U.S. Pat. No. 4,885,211, the disclosure of which is totally incorporated herein by reference.

The thickness of the anodes 12, 22, 32 can be from about 1 nanometer to about 5,000 nanometers with the thickness values depending on the optical constants of the anode material. One thickness of the anode is from about 30 nanometers to about 300 nanometers with thicknesses outside of these values being useful in embodiments.

The hole transport materials used to form the hole transport regions 13, 23 on the anodes 12, 22 can be any suitable known or later developed material. Suitable hole transport materials include, but are not limited to, conductive materials such as polyaniline and its acid-doped forms, polypyrrole, poly(phenylene vinylene), and known semiconductive organic materials; porphyrin derivatives such as 1,10,15,20-tetraphenyl-21H,23H-porphyrin copper (II) disclosed in U.S. Pat. No. 4,356,429, the disclosure of which is totally incorporated herein by reference; copper phthalocyanine, copper tetramethyl phthalocyanine; zinc phthalocyanine; titanium oxide phthalocyanine; magnesium phthalocyanine; and the like. Mixtures of these and other suitable materials can also be used. A specific class of hole transporting materials are the aromatic tertiary amines such as those disclosed in U.S. Pat. Nos. 4,539,507, 4,720,432 and 5,061,569, the disclosures of which are totally incorporated herein by reference. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl) cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N', N'-tetra-p-tolyl-1,1'-biphenyl-4,4'-diamine, N,N'-di-1-naphthyl-N,N'-diphenyl-1,1'-biphenyl-4,4'-diamine. Other illustrative examples of tertiary aromatic amines are N,N,N',N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are N,N'-di-1-naphthyl-N,N'-diphenyl-1,1'-biphenyl-4,4'-diamine; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Preferred hole transport materials in embodiments include N,N'-di(naphthalene-1-yl)-N,N'-diphenyl-benzidine (NPB), N,N'-bis(p-biphenyl)-N,N'-diphenyl benzidine (biphenyl TPD) and derivatives thereof. Examples of further aromatic tertiary amines selected for the hole transport region 13, 23 are polynuclear aromatic amines, such as N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl] aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N, N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as 4,4'-bis(9-carbazolyl)-1,1'-biphenyl compounds include 4,4'-bis(9-carbazolyl)-1,1'-biphenyl and 4,4'-bis(3-methyl-9-carbazolyl)-1,1'-biphenyl, and the like, with a specific class of hole transport materials being the indolocarbazoles, such as those described in U.S. Pat. Nos. 5,942,340 and 5,952,115, the disclosures of which are totally incorporated herein by reference, such as, for example 5,11-di-naphthyl-5,11-dihydroindolo[3,2-b]carbazole and 2,8-dimethyl-5,11-di-naphthyl-5,11-dihydroindolo[3,2-b] carbazole; N,N,N',N'-tetraaryl benzidines, wherein aryl may be selected from phenyl, m-tolyl, p-tolyl, m-methoxyphenyl, p-methoxyphenyl, 1-naphthyl, 2-naphthyl and the like; illustrative examples of N,N,N',N'-tetraarylbenzidine being N,N'-di-1-naphthyl-N,N'-diphenyl-1,1'-biphenyl-4,4'-diamine; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like.

The hole transport region 13, 23 can include a layer comprising a mixture of a porphyrin and a hole transport material, such as, for example, a tertiary aromatic amine or an indolocarbazole, thus the hole transport region can be formed essentially of a layer comprising a mixture of a porphyrin, such as, for example, copper phthalocyanine (CuPc), and a hole transport material such as for example, an indolocarbazole, or a tertiary aromatic amine, such as, for example, di(naphthalene-1-yl)-N,N'-diphenyl-benzidine (NPB) or N,N'-bis(p-biphenyl)-N,N'-diphenyl benzidine (biphenyl TPD).

The hole transport region 13, 23 can further comprise a buffer layer comprised of a material with desirable hole injection and transport properties and selected such that device performance is improved, as disclosed in more detail in copending patent application U.S. Ser. No. 09/770,159, the disclosure of which is totally incorporated herein by reference. Suitable materials that can be utilized in the buffer layer include semiconductive organic materials; such as, for example, porphyrin derivatives like 1,10,15,20-tetraphenyl-21H,23H-porphyrin copper (II) disclosed in U.S. Pat. No. 4,356,429, the disclosure of which is totally incorporated herein by reference; copper phthalocyanine, copper tetramethyl phthalocyanine; zinc phthalocyanine; titanium oxide phthalocyanine; magnesium phthalocyanine; and the like; semiconductive and insulative metal compounds, such as for example metal oxides like MgO, $Al_2O_3$, BeO, BaO, AgO, SrO, SiO, $SiO_2$, $ZrO_2$, CaO, $Cs_2O$, $Rb_2O$, $Li_2O$, $K_2O$ and $Na_2O$; and metal halides like LiF, KCl, NaCl, CsCl, CsF and KF. The hole transport region 13, 23 including the optional buffer layer can be prepared by forming, for example, one of the above-described materials into thin films by any suitable known or later developed method. Suitable methods for this purpose include, for example, vapor deposition and spin-coating techniques. The optional buffer layer can be located at any position within the hole transport regions 13, 23, that is, it can be located such that one surface of the optional buffer layer coincides with one surface of the hole transport regions 13, 23; in this situation the optional buffer layer is contacting either the anodes 12, 22, or the mixed regions 14, 24 can be located such that the two surfaces of the buffer layer are in between the two surfaces of the hole transport regions 13, 23. In specific preferred embodiments, the buffer layer is located in contact with the anodes 12, 22.

The hole transport regions 13, 23 including the optional buffer layer can have a thickness of from about 5 nanometers to about 500 nanometers. The optional buffer layer can have a thickness of from about 1 nanometer to about 100 nanometers. The thickness of the buffer layer is at least 1 nanometer less than the thickness of the hole transport regions 13, 23. A specific thickness for the optional buffer layer is in embodiments from about 5 nanometers to about 25 nanometers, or from about 1 nanometer to about 5 nanometers, and a thickness outside of these values may also be selected.

With further respect to the buffer layer, from Z. D. Popovic et al., *Proceedings of the SPIE*, Vol. 3176, "Organic Light-Emitting Materials and Devices II," San Diego, Calif., Jul. 21–23, 1998, pp. 68–73, the disclosure of which is totally incorporated herein by reference, and U.S. Ser. No. 09/357,551, the disclosure of which is totally incorporated herein by reference, the thickness of the hole transport regions 13, 23 may have an influence on the performance of the organic light emitting device. Also, as disclosed in copending patent application U.S. Ser. No. 09/770,159, the disclosure of which is totally incorporated herein by reference, the thickness of the hole transport regions 13, 23 exclusive of the thickness of the optional buffer layer in the hole transport regions 13, 23 also may influence the performance of the device, where, in general, reducing the thickness of the hole transport regions 13, 23 without reducing the thickness of the buffer layer can lead to a desirable increase in device stability, and simultaneously, to an undesirable decrease in device efficiency. There may, therefore, be a desirable thickness for the hole transport regions 13, 23 for a particular thickness of the optional buffer layer in that region. A specific thickness of the hole transport region exclusive of the thickness of the optional buffer layer (the remaining thickness of the hole transport region after the thickness of the buffer layer is subtracted) is from about 5 nanometers to about 15 nanometers, or is from about 15 nanometers to about 75 nanometers.

The mixed regions 14, 24, 34 formed on the hole transport regions 13, 23 or the anode 32 comprises, for example, from about 20 weight percent to about 80 weight percent N,N'-bis(p-biphenyl)-N,N'-diphenyl benzidine (biphenyl TPD) hole transport material; from about 80 weight percent to about 20 weight percent an electron transport material, which can also be a luminescent material, such as, for example, a metal oxinoid, and optionally, the mixed regions 14, 24, 34 can further comprise a luminescent material, such as, for example, from about 0.01 weight percent to about 10 weight percent of a fluorescent material or from about 0.01 weight percent to about 25 weight percent of a phosphorescent material, where all weight percents are based on the total weight of materials comprising the mixed region. In embodiments, the mixed regions 14, 24, 34 formed on the hole transport regions 13, 23 or the anode 32 comprises from about 35 weight percent to about 65 weight percent N,N'-bis(p-biphenyl)-N,N'-diphenyl benzidine (biphenyl TPD) hole transport material and from about 65 weight percent to about 35 weight percent an electron transport material, either of which can also function as a luminescent material of, for example, a metal oxinoid.

The mixed regions 14, 24, 34 can comprise more than one layer. For example, the mixed regions 14, 24, 34 can selectively be formed to include two, three or even more separate layers. In such structures, the mixing ratios of the hole transport material, the electron transport material, or the optional additional luminescent material can be the same in each of the layers, or the mixing ratios can be varied in the layers. For example, the multiple layers can each comprise an equal weight percentage of the hole transport material and the electron transport material, or the mixed region can comprise different amounts of these materials.

The mixed regions 14, 24, 34 can optionally further comprise one or more organic luminescent materials. Illustrative examples of luminescent materials that can be utilized in the mixed regions 14, 24, 34 include fluorescent dyes, such as, for example, those disclosed in U.S. Pat. No. 4,769,292, the disclosure of which is totally incorporated herein by reference, like coumarin, dicyanomethylene pyranes, polymethine, oxabenzanthrane, xanthene, pyrylium, carbostyl, perylene, and the like; dyes selected from the quinacridone derivatives of, for example, the Formula

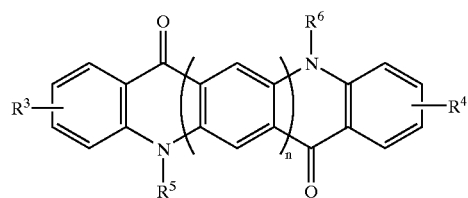

wherein $R^3$ and $R^4$ are independently hydrogen, alkyl, alkoxyl, aryl, fused aryl, such as naphthyl, or halogen; $R^5$ and $R^6$ are independently hydrogen, alkyl or aryl; and n equals 0, 1, 2 or 3. Illustrative examples of suitable quinacridone dyes include N,N'-dimethylquinacridone, N,N'-dimethyl-2-methyl quinacridone, N,N'-dimethyl-2,9-dimethylquinacridone, N,N'-dimethyl-2-chloroquinacridone, N,N'-dimethyl-2-fluoroquinacridone, and N,N'-dimethyl-1,2-benzoquinacridone. Another class of fluorescent materials are the quinacridone dyes of quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methyl-quinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like, as described in U.S. Pat. Nos. 5,227,252; 5,276,381 and 5,593,788, the disclosures of which are each totally incorporated herein by reference.

A specific class of luminescent materials that can be utilized in the mixed region in addition to the electron transport, which may or may not also function as a luminescent source 14, 24, 34 are the fused ring fluorescent dyes. Examples of the fused ring fluorescent dyes include perylene, rubrene, anthracene, coronene, phenanthrecene, pyrene and the like, reference U.S. Pat. No. 3,172,862, the disclosure of which is totally incorporated herein by reference. Other fluorescent materials that can be used include butadienes, such as 1,4-diphenylbutadiene and tetraphenylbutadiene, stilbenes and the like, as described in U.S. Pat. Nos. 4,356,429 and 5,516,577, the disclosures of which are totally incorporated herein by reference; the fluorescent materials illustrated in U.S. Pat. No. 5,601,903, the disclosure of which is totally incorporated herein by reference; and those disclosed in U.S. Pat. No. 5,935,720, the disclosure of which is totally incorporated herein by reference, such as, for example, 4-(dicyanomethylene)-2-I-propyl-6-(1,1,7,7-tetramethyljulolidyl-9-enyl)-4H-pyran and (2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4-ylidene)propanedinitrile (DCJTB; coumarins of the Formula

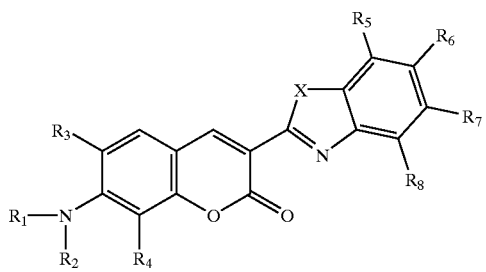

wherein X is selected from the group consisting of oxygen atom, sulfur atom, alkyl imino group ($R_9$—N=, wherein $R_9$ is an alkyl group with from about 1 to about 10 carbons), and aryl imino group (Ar—N=, wherein Ar is a phenyl group); $R_1$ and $R_2$ are individually selected from the group consisting of alkyl of from 1 to about 20 carbon atoms, aryl, and carbocyclic systems; $R_3$ and $R_4$ are individually selected from the group consisting of hydrogen atom, alkyl of from 1 to 10 carbon atoms; and $R_5$, $R_6$, $R_7$, and $R_8$ are individually selected from the group consisting of hydrogen atom, alkoxy of from 1 to about 10 carbon atoms, and alkyl of from 1 to about 20 carbon atoms with an example of a coumarin dye being 10-2-(benzothiazolyl)-2,3,6,7-tetrahydro-1,1,7,7-tetramethyl-1H, 5H, 11H-(1)benzopyropyrano (6,7,-8-ij)quinolizin-11-one (C545T), and others as disclosed in U.S. Pat. No. 6,020,078, the disclosure of which is totally incorporated herein by reference; the lanthanide metal chelate complexes, such as for examples, tris(acetylacetonato)(phenanthroline) terbium, tris(acetyl acetonato)(phenanthroline) europium, and tris(thenoyl trisfluoroacetonato) (phenanthroline) europium, as those disclosed in Kido et al., "White light emitting organic electroluminescent device using lanthanide complexes", Jpn. J Appl. Phys., Volume 35, pp. L394–L396 (1996); the phosphorescent materials, such as, for example, organometallic compounds containing a heavy metal atoms that can permit strong spin-orbit coupling such as those disclosed in Baldo et. al., "Highly efficient organic phosphorescent emission from organic electroluminescent devices", Letters to Nature, Volume 395, pp 151–154 (1998). Specific examples include 2,3,7,8,12,13,17,18-octaethyl-21H,23H-phorpine platinum(II) (PtOEP) and others, such as, for example, those disclosed in U.S. Pat. No. 6,048,630, the disclosure of which is totally incorporated herein by reference, and fac tris(2-phenylpyridine)iridium (Ir(ppy)$_3$).

The luminescent material or compound need not be present in the mixed region in embodiments providing that this region is capable of emitting light, thus the electron transport can also function as a light emitter or an electroluminescent material. Both the electron transport material and the luminescent material can be present, including in embodiments where a number of different colors are desired.

Examples of electron transport materials for mixed regions 14, 24, 34 and the electron transport regions 15, 35 situated on the mixed regions 14, 34 can be the same or different materials, reference copending patent application U.S. Ser. No. 10/005,930, filed concurrently herewith, the disclosure of which is totally incorporated herein by reference, wherein the use of different electron transport materials in the mixed regions 14, 24, 34 and the electron transport regions 15, 35 can enable desirable features, such as, for example, an increase in the efficiency of the organic light emitting devices 10, 20, 30; also, the electron transport materials used in the different layers of the multiple-layer electron transport region can be different or similar.

Illustrative examples of electron transport materials that can be used in the mixed regions 14, 24, 34 and the electron transport regions 15, 35 include, but are not limited to, the metal oxinoids as those disclosed in U.S. Pat. Nos. 4,539,507; 5,151,629; 5,150,006; 5,141,671, and 5,846,666, the disclosures of which are totally incorporated herein by reference. Illustrative examples include tris(8-hydroxyquinolinate) aluminum (Alq$_3$), which is a preferred electron transport material. Another preferred example is bis(8-hydroxyquinolato)-(4-phenylphenolato)aluminum (Balq). Other examples include tris(8-hydroxyquinolinate) gallium, bis(8-hydroxyquinolinate) magnesium, bis(8-hydroxyquinolinate)zinc, tris(5-methyl-8-hydroxyquinolinate)aluminum, tris(7-propyl-8-quinolinolato)aluminum, bis[benzo{f}-8-quinolinate]zinc, bis(10-hydroxybenzo[h] quinolinate) beryllium, and the like.

Further, examples of electron transport materials for the mixed regions 14, 24, 34 and the electron transport regions 15, 35 are stilbene derivatives, such as those disclosed in U.S. Pat. No. 5,516,577, the disclosure of which is totally incorporated herein by reference, such as 4,4'-bis(2,2-diphenylvinyl)biphenyl; metal thioxinoid compounds, illustrated in U.S. Pat. No. 5,846,666, the disclosure of which is totally incorporated herein by reference, such as bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinotinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethioato]zinc, bis[3,7-dimethylbenzo{f}-8-quinolinethiolato]zinc, and the like; the oxadiazole metal chelates disclosed in U.S. Pat. No. 5,925,472, the disclosure of which is totally incorporated herein by reference, such as bis[2-(2-hydroxyphenyl)-5-phenyl-1,3,4-oxadiazolatolzinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato] zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato] zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3, 4-thiol)adiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; bis[2-(2- hydroxyphenyl)-5-(1-naphthyl)-1,3,4-thiadiazolato] beryllium, and the like; quinolines, such as, for example, 1,4-bis(4-phenylquinolin-2-yl)benzene, 4,4'-bis(4-phenylquinolin-2-yl)-1,1'-biphenyl (TA; the triazines as described in U.S. Pat. No. 6,057,048 and U.S. Pat. No. 6,229,012, the disclosures of which are totally incorporated herein by reference, such as, for example, 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, 2,4,6-tris(4-biphenylyl)-1,3,5-triazine, and the like.

The mixed regions 14, 24, 34 can have a thickness of, for example, from about 10 nanometers to about 2,000 nanometers, or from about 20 nanometers to about 200 nanometers. Reducing the thickness of the mixed regions 14, 24, 34 may enable in embodiments a desirable decrease in the operational voltage of the organic light emitting device, while simultaneously, however, providing an undesirable decrease in the luminance (and EL efficiency) of the organic light emitting device of this invention.

The mixed regions 14, 24, 34 can be formed by any suitable method that enables the formation of selected mixtures of the N,N'-bis(p-biphenyl)-N,N'-diphenyl benzidine (biphenyl TPD) hole transport material, the electron transport material and the optional luminescent material. For example, the mixed regions 14, 24, 34 can be formed by coevaporating the N,N'-bis(p-biphenyl)-N,N'-diphenyl benzidine (biphenyl TPD) hole transport material, electron transport material, and the optional luminescent material.

The cathodes 16, 26, 36 formed on the electron transport regions 15, 35 or the mixed region 24 can comprise suitable electron injecting materials, such as metals, including high work function components, such as metals with, for example, a work function from about 4 eV to about 6 eV, or low work function components, such as metals with, for example, a work function of from about 2 eV to about 4 eV. The cathodes 16, 26, 36 can comprise a combination of a low work function (less than about 4 eV) metal and at least one other metal. Effective proportions of the low work function metal to the second or other metal are from less than about 0.1 weight percent to about 99.9 weight percent. Illustrative examples of low work function metals include, but are not limited to, alkaline metals such as lithium or sodium; Group 2A or alkaline earth metals, such as beryllium, magnesium, calcium or barium; and Group III metals including rare earth metals and the actinide group metals, such as scandium, yttrium, lanthanum, cerium, europium, terbium or actinium. Lithium, magnesium and calcium are preferred low work function metals. The Mg—Ag alloy cathodes described in U.S. Pat. No. 4,885,211 and U.S. Pat. No. 4,720,432, the disclosures of which are totally incorporated herein by reference, disclose cathode materials for forming the cathodes 16, 26, 36. Specific cathodes are described in copending patent application U.S. Ser. No. 09/721,736, the disclosure of which is totally incorporated herein by reference, such as a metal-organic mixed region including (i) a metal first component, such as, for example, Mg; (ii) an organic material second component, such as, for example, $AlQ_3$; and (iii) at least one third component selected from the group consisting of metals, organic materials and inorganic materials, such as, for example, Ag, and cathodes are described in U.S. Pat. No. 5,429,884, the disclosure of which is totally incorporated herein by reference, formed from lithium alloys with other high work function metals such as aluminum and indium.

The cathodes 16, 26, 36 can also include an electron injection layer in contact with the electron transport regions 15, 35 or the mixed region 24 made of an insulative material, such as an oxide material or an alkaline metal compound as described in U.S. Pat. Nos. 5,457,565; 5,608,287 and 5,739,635, the disclosure of which is totally incorporated herein by reference. The thickness of the cathodes 16, 26, 36 can be from, for example, about 10 nanometers to about 1,000 nanometers. Of course, thicknesses outside of this range can also be used.

The organic light emitting devices can include a thermal protective element or layer formed on the cathodes 16, 26, 36 and/or on the anodes 12, 22, 32. Embodiments of thermal protective elements are disclosed in more detail in copending applications U.S. Ser. No. 09/770,159 and U.S. Ser. No. 09/770,154), the disclosures of which are totally incorporated herein by reference. Typically, the thermal protective layer is comprised of a layer comprised of SiO, $SiO_2$ and/or mixtures thereof with a thickness of, for example, from about 300 nanometers to about 5,000 nanometers.

The following Examples are provided. In these Examples, "region" refers to one layer unless otherwise indicated.

EXAMPLE I

Example to Demonstrate Operational Stability At 90° C. (Degrees Centigrade) of an Organic Light Emitting Device, wherein the Mixed Layer Contains (1) N,N'-Bis(P-Biphenyl)-N,N'-Diphenyl Benzidine (Biphenyl TPD) Hole Transport Material, and (2) a Luminescent Electron Transport Material:

An organic light emitting device, such as device 10 in FIG. 1, was formed and evaluated. In this device, N,N'-bis (p-biphenyl)-N,N'-diphenyl benzidine (biphenyl TPD) and tris(8-hydroxyquinoline)aluminum ($Alq_3$) were selected as the hole transport material and the electron transport material, respectively, comprising the hole transport 13 region, the mixed region 14, and the electron transport region 15 in the organic light emitting device 10. The mixed region 14 was comprised of about 50 weight percent of biphenyl TPD and about 50 weight percent of $Alq_3$.

Copper phthalocyanine (CuPc) was used to form a buffer layer in the hole transport region 13 where the buffer layer was in contact with the anode 12. The thickness of the buffer layer was about 15 nanometers; the thickness of the hole transport region 13 was about 25 nanometers; the thickness of the mixed region 14 was about 80 nanometers; the thickness of the electron transport region 15 was about 20 nanometers; and the hole transport region 13, the mixed layer 14 and the electron transport region 15 were formed between an anode 12 comprised of indium-tin-oxide (ITO) having a thickness of about 200 nanometers, precoated on a glass substrate; and a cathode 18 comprised of a Mg:Ag (10:1 by weight) alloy having a thickness of about 120 nanometers. A thermal protective layer comprised of silicon monoxide (SiO) and having a thickness of about 200 nanometers was coated on the cathode 16.

The above organic light emitting device was fabricated using a vacuum evaporation process at a pressure of about $6 \times 10^{-6}$ torr. The mixed region 14 was generated by coevaporation of pure, about 99 to 100 percent pure, biphenyl TPD and pure, about 99 to 100 percent pure, $Alq_3$ from separate sources with the evaporation rate of each being controlled at about 3 A/s (angstroms per second) to obtain the desired mixing ratio of the mixed region 14. Following formation of the organic hole transport region 13, the mixed region 14, and the electron transport region 15, the metal cathode 16 was deposited on the electron transport region 15 without breaking the vacuum.

The operational lifetime was tested with the organic light emitting device operated at a temperature of 90° C. in nitrogen gas under AC driving conditions at an average constant current density of 31.25 mA/cm$^2$ (milliamperes per square centimeter mA/cm$^2$). At this current density, the organic light emitting device produced green emission at a luminance of about 800 cd/m$^2$ (candela per square meter) as measured by a Monolta model Cs 100 Chroma Meter.

From operational lifetime tests, the device half-life (the time elapsed before the device luminance decreases to half the initial luminance) from an initial luminance of about 800 cd/M$^2$ was about 700 hours for continuous device operation at a temperature of 90° C. Since the device half-life is measured at an initial luminance of about 800 cd/m$^2$, which is about 8 times brighter than a typical initial display luminance of 100 cd/m$^2$ under usual display operation conditions, i.e. at an initial luminance of about 100 cd/M2, the measured half-life of 700 hours represents an accelerated half-life under high stressing conditions at 90° C., which corresponds to a half-life of about 5,600 hours (8×700 hours) at 90° C. under a typical initial display luminance of 100 cd/M$^2$.

EXAMPLE II

Example to Demonstrate Operational Stability at 90° C. of an Organic Light Emitting Device, Wherein the Mixed Layer Comprises (1) N,N'-Bis(P-Biphenyl)-N,N'-Diphenyl Benzidine (Biphenyl TPD) Hole Transport Material; (2) a Luminescent Electron Transport Material; and (3) a Luminescent Material Comprising a Fluorescent Dye:

An organic light emitting device having a structure, such as device 10 in FIG. 1, was formed and evaluated. In this device, N,N'-bis(p-biphenyl)-N,N'-diphenyl benzidine (biphenyl TPD) and tris(8-hydroxyquinoline)aluminum (Alq$_3$) were selected as the hole transport material and the electron transport material, respectively, comprising the hole transport 13 region, the mixed region 14, and the electron transport region 15 in the organic light emitting device 10. The mixed region 14 was comprised of about 49.80 weight percent of biphenyl TPD; about 49.80 weight percent of Alq$_3$; and further was comprised 0.4 weight percent of rubrene fluorescent dye as a luminescent material.

Copper phthalocyanine (CuPc) was used to form a buffer layer in the hole transport region 13, where the buffer layer was in contact with the anode 12. The thickness of the buffer layer was about 15 nanometers; the thickness of the hole transport region 13 was about 25 nanometers; the thickness of the mixed region 14 was about 80 nanometers; and the thickness of the electron transport region 15 was about 20 nanometers. The hole transport region 13, the mixed layer 14 and the electron transport region 15 were formed between an anode 12 comprised of indium-tin-oxide (ITO) having a thickness of about 200 nanometers, precoated on a glass substrate, and a cathode 18 comprised of a Mg:Ag (10:1 by weight) alloy having a thickness of about 120 nanometers. A thermal protective layer comprised of silicon monoxide (SiO) and having a thickness of about 200 nanometers was coated on the cathode 16.

The above organic light emitting device was fabricated using a vacuum evaporation process at a pressure of about 6×10$^{-6}$ torr. The mixed region 14 was produced by coevaporation of pure biphenyl TPD, pure Alq$_3$ and pure rubrene from separate sources with the single evaporation rates being controlled between about 0.1 to about 10 A/s to obtain the desired mixing ratio of the mixed region 14. Following formation of the organic hole transport region 13, the mixed region 14, and the electron transport region 15, the metal cathode 16 was deposited on the electron transport region 15 without breaking the vacuum.

The operational lifetime was tested with the above prepared organic light emitting device operated at a temperature of 90° C. in nitrogen gas under AC driving conditions at an average constant current density of 31.25 mA/cm$^2$. At this current density, the organic light emitting device produced yellow emission at a luminance of about 1,500 cd/m$^2$ (candela per square meter).

From operational lifetime tests, the device half-life (the time elapsed before the device luminance decreases to half the initial luminance) from an initial luminance of about 1,500 cd/m$^2$ was about 700 hours for continuous device operation at a temperature of 90° C. Since the device half-life is measured at an initial luminance of about 1,500 cd/m$^2$, which is about 15 times brighter than a typical initial display luminance of 100 cd/m$^2$ under normal conditions, the measured half-life of 700 hours represents an accelerated half-life under high stressing conditions at 90° C., which corresponds to a half-life of about 10,000 hours (15×700 hours) at 90° C. under a typical initial display luminance of 100 cd/m$^2$.

Examples I and II demonstrate that organic light emitting devices according to embodiments of this invention can be used in applications when a device half-life of several thousands of hours at an initial luminance of about 100 cd/m$^2$ at high temperature operation conditions, such as, for example, temperatures of from about 80° C. to about 100° C. or above are selected. Furthermore, the organic light emitting devices can produce different emission colors, such as, for example, red, yellow, green, or blue emission, by using different luminescent materials in the mixed regions 14, 24, 34. In addition, the organic light emitting devices with a mixed region can provide in embodiments enhanced device lifetimes at room temperature conditions as compared to a number of known devices that use, for example, a buffer layer as the hole injecting contact, or a doped hole transport layer, reference U.S. Ser. No. 09/357,551, the disclosure of which is totally incorporated herein by reference.

In contrast, the half-life of a prior-art device, such as, for example, a number of EL devices illustrated in Val Slyke et al. referenced herein is believed to be limited to few hundred hours or less, at an initial luminance of 100 cd/m$^2$, at high temperatures of 90° C., reference, for example, the prior art EL devices of J. R. Sheats et al, "Organic Electroluminescent Devices", Science 273, pp. 884–888, 1996, and also S. Tokito et al., "High-Temperature Operation of an Electroluminescent Device Fabricated Using a Novel Triphenylamine Derivative", *Appl. Phys. Lett.* 69, 878 (1996).

"Region" in the Examples above can also refer to at least 2 layers, and more specifically, from 2 to about 3 layers. Organic light emitting devices illustrated herein can be selected for various normal temperature condition technological applications. Furthermore, operational stability of organic light emitting devices enables them to be used at high temperatures and in harsh conditions. For example, the devices can be used in various types of displays such as, for example, in automobiles and other types of vehicles, computer monitors, televisions and electronic devices and systems. Moreover, the devices can be used in harsh conditions, such as in industrial applications where high temperatures are often present. Also, the devices in embodiments provide stable performance at high temperatures of at least, for example, about 50° C. or about 70° C. or even higher, for example about 100° C., and also at temperatures of about 20° C. to about 70° C. for extended lifetimes, such as, at least about 1,000 hours. Thus, the organic light emitting devices can be used in applications in which conventional bilayer devices would not be suitable. In addition, the organic light emitting devices can utilize a hole transport material which has a higher thermal stability and which can be economically synthesized.

Region, regions, zone, and the like refer in embodiments, for example, to one layer, a number of layers, such as two layers, and the like, such as from about 2 to about 7 layers.

Other embodiments and modifications of the present invention may occur to those skilled in the art subsequent to a review of the information presented herein; these embodiments and modifications, equivalents thereof, substantial equivalents thereof, or similar equivalents thereof are also included within the scope of this invention.

What is claimed is:

1. An organic light emitting device comprising
   (i) a first electrode;
   (ii) a region comprising a mixture of (1) N,N'-bis(p-biphenyl)-N,N'-diphenyl benzidine, and (2) an electron transport material, and which region further optionally comprises an organic luminescent material, and wherein said mixed region is capable of emitting light in response to hole-electron recombination;
   (iii) a second electrode;
   (iv) a thermal layer coated on at least one of the first and second electrodes, wherein one of said first and second electrodes is a hole injection anode, and one of said electrodes is an electron injection cathode, and wherein the organic light emitting device further comprises at least one of
   (v) a hole transport region interposed or situated between the first electrode and the mixed region; or
   (vi) an electron transport region interposed or situated between the mixed region and the cathode.

2. A device in accordance with claim 1 wherein there is at least one of (A) the hole transport material comprising the hole transport region (v) is selected from the group consisting of aromatic amines, porphyrins and indolocarbazoles, or wherein (B) the electron transport material comprising the mixed region (ii) or the electron transport of region (vi) is selected from the group consisting of metal oxinoids, stilbenes, triazines, porphyrins, and quinolines.

3. A device in accordance with claim 1 wherein in the mixed region (ii) the electron transport material is a metal oxinoid.

4. A device in accordance with claim 1 wherein the mixed region comprises from about 20 weight percent to about 80 weight percent of said N,N'-bis(p-biphenyl)-N,N'-diphenyl benzidine; and said electron transport component or material is present in an amount of from about 80 weight percent to about 20 weight percent and said electron transport is a metal oxinoid, and wherein the weight percents are based on the total weight of materials comprising the mixed region (ii).

5. A device in accordance with claim 1 wherein the mixed region comprises from about 35 weight percent to about 65 weight percent of said N,N'-bis(p-biphenyl)-N,N'-diphenyl benzidine (biphenyl TPD); and from about 65 weight percent to about 35 weight percent of said electron transport of a metal oxinoid, and wherein the weight percent total thereof is about 100 weight percent.

6. A device in accordance with claim 3 wherein the metal oxinoid is selected from the group consisting of tris(8-hydroxyquinoline) aluminum ($Alq_3$) and bis(8-hydroxyquinolato)-(4-phenylphenolato)aluminium (Balq).

7. A device in accordance with claim 1 wherein the electron transport region (vi) contains $Alq_3$ or Balq, and said mixed region (ii) contains from about 0.01 weight percent to about 10 weight percent of a fluorescent luminescent material.

8. A device in accordance with claim 7 wherein the fluorescent material is selected from the group consisting of coumarin, dicyanomethylene pyranes, polymethine, oxabenzanthrane, xanthene, pyrylium, carbostyl, perylene, acridone, quinacridone, rubrene, anthracene, coronene, phenanthrecene, pyrene, butadiene, stilbene, lanthanide metal chelate complexes, rare-earth metal chelate complexes, and 4-(dicyanomethylene)-2-i-propyl-6-(1,1,7,7-tetramethyljulolidyl-9-enyl)-4H-pyran.

9. A device in accordance with claim 7 wherein the fluorescent material is selected from the group consisting of rubrene, N,N'-dimethylquinacridone (DMQ), 10-2-(benzothiazolyl)-2,3,6,7-tetrahydro-1,1,7,7-tetramethyl-1H,5H, 11H-(1)benzopyropyrano (6,7,-8-ij) quinolizin-11-one (C545T), and (2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4-ylidene) propanedinitrile (DCJTB).

10. A device in accordance with claim 1 wherein the mixed region comprises from about 3 weight percent to about 30 weight percent of a luminescent material, and wherein the luminescent material is a phosphorescent material.

11. A device in accordance with claim 10 wherein the phosphorescent material is selected from the group consisting of 2,3,7,8,12,13,17,18-octaethyl-21H,23H-phorpine platinum(II) (PtOEP) and fac tris(2-phenylpyridine)iridium ($Ir(ppy)_3$).

12. A device in accordance with claim 1 wherein there is at least one of (A) said hole transport region (v) comprising N,N'-bis(p-biphenyl)-N,N'-diphenyl benzidine (biphenyl TPD); or (B) said electron transport region (vi) contains an electron transport material, and wherein the electron transport material in the mixed region (ii) and (vi) are similar components.

13. A device in accordance with claim 1 wherein there is at least one of (A) said hole transport material comprising said hole transport region (v) wherein said hole transport region (v) contains a hole transport material dissimilar than said (p-biphenyl)-N,N'-diphenyl benzidine; or (B) wherein said electron transport region (vi) contains an electron transport material, and wherein said electron transport material in the mixed region (ii) and region (vi) are dissimilar.

14. A device in accordance with claim 1 wherein each of said regions (ii), (v) and (vi) contain from 1 to about 10 layers.

15. A device in accordance with claim 14 wherein (1) a first layer of said electron transport region is contacting the mixed region, and which first layer comprises a material selected from the group consisting of metal oxinoids and quinolines; and wherein (2) a second layer of the electron transport region is contacting the cathode, and which second layer comprises a material selected from the group consisting of metal oxinoid, phthalocyanine and triazine.

16. A device in accordance with claim 15 wherein said metal oxinoid is tris(8-hydroxyquinoline)aluminum ($Alq_3$), bis(8-hydroxyquinolato)-(4-phenylphenolato)aluminum (Balq), or a quinoline of 1,4-bis(4-phenylquinolin-2-yl) benzene, 4,4'-bis(4-phenylquinolin-2-yl)-1,1'-biphenyl (TA); and said second layer is a metal oxinoid of tris(8-hydroxyquinoline)aluminum ($Alq_3$), bis(8-hydroxyquinolato)-(4-phenylphenolato)aluminum (Balq), or a phthalocyanine comprising copper phthalocyanine (CuPc), or a triazine comprising 4,4'-bis-[2-(4,6-diphenyl- 1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, or 4,4'-bis-[2-(4,6-di-m-methoxyphenyl-1,3,5-triazinyl)]-1,1'-biphenyl, 2,4,6-tris(4-biphenylyl)-1,3,5-triazine.

17. A device in accordance with claim 1 wherein said hole transport region (v) is comprised of at least two layers.

18. A device in accordance with claim 17 wherein one layer of said hole transport region contacts the anode, and which layer comprises a porphyrin; and (2) a second layer of the hole transport region contacts the mixed region, and which second layer comprises a material selected from the group consisting of tertiary aromatic amines, and indolocarbazoles.

19. A device in accordance with claim 18 wherein the first layer comprises copper phthalocyanine, and the second layer comprises N,N'-bis(p-biphenyl)-N,N'-diphenyl benzidine (biphenyl TPD), 5,11-di-naphthyl-5,11-dihydroindolo[3,2-b]carbazole, or 2,8-dimethyl-5,11-di-naphthyl-5,11-dihydroindolo[3,2-b]carbazole.

20. A device in accordance with claim 1 wherein said hole transport region comprises a layer comprised of a mixture of from about 25 weight percent to about 99 weight percent of a porphyrin, and from about 75 weight percent to about 1 weight percent of an aromatic tertiary amine or an indolocarbazole.

21. A device in accordance with claim 20 wherein said hole transport region includes a layer comprised of a mixture of (i) a porphyrin of copper phthalocyanine (CuPc), and (ii) a tertiary aromatic amine of N,N'-bis(p-biphenyl)-N,N'-diphenyl benzidine (biphenyl TPD), or an indolocarbazole of 5,11-di-naphthyl-5,11-dihydroindolo[3,2-b]carbazole, or 2,8-dimethyl-5,11-di-naphthyl-5,11-dihydroindolo[3,2-b]carbazole.

22. A device in accordance with claim 1 wherein there is at least one of (A) said anode, which anode is optionally indium-tin-oxide, or (B) said cathode is selected from the group consisting of (i) a layer comprised of Mg and Ag; (ii) a layer comprised of Al; (iii) a layer comprised of indium-tin-oxide; and (iv) a layer comprised of (1) an organic compound, (2) Mg, and (3) Ag.

23. A device in accordance with claim 22 wherein the cathode further comprises an alkaline metal or a compound thereof.

24. A device in accordance with claim 23 wherein the alkaline metal is selected from the group consisting of Li, Na, K and Cs.

25. A device in accordance with claim 1 wherein said thermal layer is comprised of a layer of SiO, $SiO_2$ or mixtures thereof.

26. A device in accordance with claim 1 wherein the mixed region (ii) has a thickness of from about 5 nanometers to about 500 nanometers; the hole transport region (v) has a thickness of from about 5 nanometers to about 250 nanometers; and the electron transport region (vi) has a thickness of from about 5 nanometers to about 100 nanometers.

27. A device in accordance with claim 1 and comprising an anode of indium-tin-oxide with a thickness of from about 30 to about 300 nanometers coated on a substrate, the anode and the substrate being capable of transmitting at least about 70 percent of radiation of a wavelength of from about 400 nanometers to about 750 nanometers;

a hole transport region situated on the anode comprised of a material selected from the group consisting of copper phthalocyanine (CuPc), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region has a thickness of from about 5 nanometers to about 100 nanometers;

a mixed region situated on the hole transport region comprised of from about 35 weight percent to about 65 weight percent of N,N'-bis(p-biphenyl)-N,N'-diphenyl benzidine (biphenyl TPD), and from about 65 weight percent to about 35 weight percent of tris(8-hydroxyquinoline) aluminum or bis(8-hydroxyquinolato)-(4-phenylphenolato) aluminum, wherein all weight percents are based on the total weight of materials comprising the mixed region, and wherein the thickness of the mixed region is from about 20 nanometers to about 200 nanometers;

an electron transport region situated on the mixed region comprised of tris(8-hydroxyquinoline) aluminum ($Alq_3$) or bis(8-hydroxyquinolato)-(4-phenylphenolato)aluminum (Balq) wherein the thickness of the electron transport region is from about 5 nanometers to about 50 nanometers;

a cathode situated on the electron transport region comprised of one of (1) a layer comprised of Mg:Ag alloy or Al of a thickness of from about 50 nanometers to about 500 nanometers; or (2) a first layer comprised of from about 40 volume percent to about 55 volume percent of Mg; from about 2 volume percent to about 10 volume percent of $Ag_3$, wherein the thickness of the first layer is from about 100 nanometers to about 600 nanometers coated with said layers with a thickness of from about 50 nanometers to about 500 nanometers comprising a metal or a metal alloy; and a thermal protective layer situated on the cathode comprised of SiO, $SiO_2$ or mixtures thereof of a thickness of from about 100 nanometers to about 1,000 nanometers.

28. A device in accordance with claim 27 wherein the mixed region further comprises one of about 0.2 weight percent to about 2 weight percent of a luminescent material selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T);

about 0.2 weight percent to about 5 weight percent of (2-(1,1-dimethylethyl)-6-(2-(2,3,6,7-tetrahydro-1,1,7,7-tetramethyl-1H,5H-benzo(ij)quinolizin-9-yl) ethenyl)-4H-pyran-4-ylidene) propanedinitrile (DCJTB); or about 5 weight percent to about 25 weight percent of 2,3,7,8,12,13,17,18-octaethyl-21H,23H-phorpine platinum(II) (PtOEP).

29. A device in accordance with claim 1 and comprising an anode of indium-tin-oxide with a thickness of from about 30 to about 300 nanometers coated on a substrate;

a hole transport region in contact with said anode comprised of a compound selected from the group consisting of N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region further comprises a buffer layer contacting the anode, and which buffer layer is comprised of copper phthalocyanine, wherein the thickness of the buffer layer is from about 10 nanometers to about 30 nanometers, and the thickness of the hole transport region is from about 5 nanometers to about 20 nanometers greater than the thickness of the buffer layer;

a mixed region situated on the hole transport region comprised of from about 35 weight percent to about 65 weight percent of N,N'-bis(p-biphenyl)-N,N'-diphenyl benzidine (biphenyl TPD) and from about 65 weight percent to about 35 weight percent of tris(8-hydroxyquinoline)aluminum or bis(8-hydroxyquinolato)-(4-phenylphenolato) aluminum, wherein all weight percents are based on the total weight of materials comprising the mixed region, and wherein the thickness of the mixed region is from about 20 nanometers to about 200 nanometers;

an electron transport region situated on the mixed region comprised of tris(8-hydroxyquinoline)aluminum ($Alq_3$) or bis(8-hydroxyquinolato)-(4-phenylphenolato)aluminum (Balq), wherein the thickness of the electron transport region is from about 5 nanometers to about 50 nanometers;

a cathode situated on the electron transport region comprised of one of (1) a layer comprised of Mg:Ag alloy or Al of a thickness of from about 50 nanometers to about 500 nanometers; or (2) a first layer comprised of from about 40 volume percent to about 55 volume percent of Mg; from about 2 volume percent to about 10 volume percent of $Ag_3$, wherein the thickness of the first layer is from about 100 nanometers to about 600 nanometers, and coated with said layers with a thickness of from about 50 nanometers to about 500 nanometers comprising a metal or a metal alloy; and a thermal protective layer situated on the cathode comprised of SiO, $SiO_2$ or mixtures thereof of a thickness of from about 100 nanometers to about 1,000 nanometers.

30. A device in accordance with claim 29 wherein the mixed region further comprises one of from about 0.2 weight percent to about 2 weight percent of a luminescent material selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T);

from about 0.2 weight percent to about 5 weight percent of (2-(1,1-dimethylethyl)-6-(2-(2,3,6,7-tetrahydro-1,1,7,7-tetramethyl-1H,5H-benzo(ij)quinolizin-9-yl) ethenyl)4H-pyran-4-ylidene) propanedinitrile (DCJTB), or from about 5 weight percent to about 25 weight percent of 2,3,7,8,12,13,17,18-octaethyl-21H,23H-phorpine platinum(II) (PtOEP).

31. A device in accordance with claim 1 and comprising an anode of indium-tin-oxide with a thickness of from about 50 to about 300 nanometers coated on a substrate, the anode and the substrate being capable of transmitting at least about 70 percent of radiation of wavelength of from about 400 nanometers to about 750 nanometers;

a hole transport region situated on the anode comprised of at least one material selected from the group consisting of copper phthalocyanine (CuPc), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo [3,2-b]carbazole; and which region has a thickness of from about 5 nanometers to about 100 nanometers;

a mixed region situated on the hole transport region comprised of from about 35 weight percent to about 65 weight percent of N,N'-bis(p-biphenyl)-N,N'-diphenyl benzidine (biphenyl TPD) and from about 65 weight percent to about 35 weight percent of tris(8-hydroxyquinoline)aluminum or bis(8-hydroxyquinolato)-(4-phenylphenolato) aluminum; and wherein the thickness of the mixed region is from about 20 nanometers to about 200 nanometers;

an electron transport region situated on the mixed region comprising (1) a first layer of thickness from about 5 nanometers to about 25 nanometers contacting the mixed region, wherein this first layer is comprised of a material selected from the group consisting of tris(8-hydroxyquinoline)aluminum ($Alq_3$), bis(8-hydroxyquinolato)-(4-phenylphenolato)aluminum (Balq), and 1,4-bis(4-phenylquinolin-2-yl)benzene, 4,4'-bis(4-phenylquinolin-2-yl)-1,1'-biphenyl (TA); and (2) a second layer of a thickness of from about 5 nanometers to about 25 nanometers contacting the cathode, wherein the second layer is comprised of a material selected from the group consisting of tris(8-hydroxyquinoline) aluminum ($Alq_3$), bis(8-hydroxyquinolato)-(4-phenylphenolato)aluminum (Balq), copper phthalocyanine (CuPc), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, and 2,4,6-tris(4-biphenylyl)-1,3,5-triazine;

a cathode situated on the electron transport region comprised of one of (1) a layer comprised of Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag; and from about 55 volume percent to about 40 volume percent of $Alq_3$, wherein the thickness of the first layer is from about 100 nanometers to about 600 nanometers, and coated with a second layer of a thickness of from about 50 nanometers to about 500 nanometers comprising a metal or a metal alloy; and a thermal layer situated on the cathode comprised of SiO, $SiO_2$ or mixtures thereof of a thickness of from about 100 nanometers to about 1,000 nanometers.

32. A device in accordance with claim 1 wherein the mixed region further comprises one of from about 0.2 weight percent to about 2 weight percent of a luminescent material selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T);

from about 0.2 weight percent to about 5 weight percent of (2-(1,1-dimethylethyl)-6-(2-(2,3,6,7-tetrahydro-1,1,7,7-tetramethyl-1H,5H-benzo(ij)quinolizin-9-yl) ethenyl)-4H-pyran-4-ylidene)propanedinitrile (DCJTB); or from about 5 weight percent to about 25 weight percent of 2,3,7,8,12,13,17,18-octaethyl-21H,23H-phorpine platinum(II) (PtOEP).

33. A display comprising at least one organic light emitting device of claim 1.

34. A device in accordance with claim 1 and comprising in sequence
- said first electrode;
- said mixed region with from about 1 to about 3 layers comprising a mixture of (1) N,N'-bis(p-biphenyl)-N, N'-diphenyl benzidine (biphenyl TPD), and (2) an electron transport component, and which mixed region further comprises an organic luminescent material;
- said second electrode;
- a thermal layer coated on one of the first and second electrodes wherein one of said first and second electrodes is a hole injection anode, and one of said electrodes is an electron injection cathode, and wherein the organic light emitting device further comprises at least one of
- a hole transport region positioned between the first electrode and the mixed region; and
- an electron transport region positioned between the mixed region and the cathode.

35. A device in accordance with claim 34 wherein the mixed region emits light in response to hole electron recombination.

36. A device in accordance with claim 1 further including a buffer layer in said hole transport region (v).

37. A device in accordance with claim 1 wherein said protective layer, and which device further contains a buffer layer.

38. A device in accordance with claim 1 wherein each of said regions contains from 1 to about 5 layers.

39. A device in accordance with claim 1 wherein each of said regions contains from about 2 to about 4 layers.

40. A device in accordance with claim 1 wherein said electron transport of (ii) also functions as a luminescent material or a light emitter.

41. A device in accordance with claim 1 wherein a luminescent component is further contained in the mixed region, and wherein said electron transport is free of functioning as an emitter.

42. A device comprising
(i) a first electrode;
(ii) a region comprising a mixture of (1) N,N'-bis(p-biphenyl)-N,N'-diphenyl benzidine, and (2) an electron transport material, and which region further optionally comprises an organic luminescent material,
(iii) a second electrode;
(iv) a thermal layer coated on at least one of the first or second electrodes, wherein one of said first and second electrodes is a hole injection anode, and one of said electrodes is an electron injection cathode, and wherein the organic light emitting device further comprises at least one of
(v) a hole transport region interposed or situated between the first electrode and the mixed region; and
(vi) an electron transport region interposed or situated between the mixed region and the cathode, and wherein said device contains in said region (ii) a luminescent component wherein said electron transport material also functions as a luminescent component, or wherein said region (ii) is free of a luminescence component where said electron transport component also functions as a luminescent component.

43. An organic light emitting device comprising
i) a first electrode;
(ii) a region comprising a mixture of (1) N,N'-bis(p-biphenyl)-N,N'-diphenyl benzidine, and (2) an electron transport material, and which region further optionally comprises an organic luminescent material, and wherein said mixed region is capable of emitting light in response to hole-electron recombination;
(iii) a second electrode;
(iv) a thermal layer coated an at least one of the first or second electrodes, wherein one of said first and second electrodes is a hole injection anode, and one of said electrodes is an electron injection cathode, and wherein a hole transport region is interposed or situated between the first electrode and the mixed region;
(v) a hole transport region interposed or situated between the first electrode and the mixed region; and
(vi) an electron transport region interposed, or situated between the mixed region and the cathode.

44. An organic light emitting device comprised of
(i) a first electrode:
(ii) a region comprising a mixture of (11 N,N'-bis(p-biphenyl)-N,N'-diphenyl benzidine, and (2) an electron transport material, and which region further optionally comprises an organic luminescent material, and wherein said mixed region is capable of emitting light in response to hole-electron recombination;
(iii) a second electrode;
(iv) a thermal layer coated on at least one of the first or second electrodes, wherein one of said first and second electrodes is a hole injection anode, and one of said electrodes is an electron injection cathode, and wherein a hole transport region is interposed or situated between the first electrode and the mixed region;
(v) a hole transport region interposed or situated between the first electrode and the mixed region; and
(vi) an electron transport region interposed or situated between the mixed region and the cathode; and wherein said electron transport region is interposed or situated between the mixed region and the cathode.

45. A device in accordance with claim 1 wherein a hole transport region is situated between the first electrode and the mixed region and an electron transport region is situated between the mixed region and the cathode.

* * * * *